(12) United States Patent
Das et al.

(10) Patent No.: US 9,780,075 B2
(45) Date of Patent: Oct. 3, 2017

(54) INTERCONNECT STRUCTURES FOR ASSEMBLY OF MULTI-LAYER SEMICONDUCTOR DEVICES

(71) Applicant: Massachusetts Institute of Technology, Cambridge, MA (US)

(72) Inventors: Rabindra N. Das, Lexington, MA (US); Donna-Ruth W. Yost, Acton, MA (US); Chenson Chen, Waban, MA (US); Keith Warner, Whitinsville, MA (US); Steven A. Vitale, Waltham, MA (US); Mark A. Gouker, Belmont, MA (US); Craig L. Keast, Groton, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 15/327,235

(22) PCT Filed: Aug. 11, 2015

(86) PCT No.: PCT/US2015/044608
§ 371 (c)(1),
(2) Date: Jan. 18, 2017

(87) PCT Pub. No.: WO2016/025451
PCT Pub. Date: Feb. 18, 2016

(65) Prior Publication Data
US 2017/0200700 A1    Jul. 13, 2017

Related U.S. Application Data

(60) Provisional application No. 62/035,713, filed on Aug. 11, 2014.

(51) Int. Cl.
*H01L 23/52*      (2006.01)
*H01L 25/065*     (2006.01)
(Continued)

(52) U.S. Cl.
CPC ...... *H01L 25/0657* (2013.01); *H01L 23/5226* (2013.01); *H01L 23/53209* (2013.01);
(Continued)

(58) Field of Classification Search
CPC ... H01L 25/06; H01L 25/065; H01L 25/0657; H01L 25/50; H01L 23/52; H01L 23/522;
(Continued)

(56) References Cited

U.S. PATENT DOCUMENTS 4,316,200 A    2/1982  Ames et al.
4,612,083 A    9/1986  Yasumoto et al.
(Continued)

FOREIGN PATENT DOCUMENTS

WO   WO 2016/025478 A1   2/2016
WO   WO 2016/073049 A1   5/2016
WO   WO 2017/015432 A1   1/2017

OTHER PUBLICATIONS

International Preliminary Report dated Feb. 23, 2017 for PCT Application No. PCT/US2015/044608; 9 pages.
(Continued)

*Primary Examiner* — Monica D Harrison
(74) *Attorney, Agent, or Firm* — Daly, Crowley, Mofford & Durkee, LLP

(57) ABSTRACT

A multi-layer semiconductor device includes at least two semiconductor structures, each of the at least two semiconductor structures having first and second opposing surfaces and including a first section and a second section. The second section includes a device layer and an insulating layer. The multi-layer semiconductor device also includes one or more conductive structures and one or more interconnect pads. Select ones of the one or more interconnect pads are electrically coupled to the one or more conductive structures. The multi-layer semiconductor device addition-
(Continued)

ally includes a via joining layer disposed between and coupled to second surfaces of each of the at least two semiconductor structures. A corresponding method for fabricating a multi-layer semiconductor device is also provided.

20 Claims, 11 Drawing Sheets

(51) Int. Cl.
    *H01L 25/00* (2006.01)
    *H01L 23/522* (2006.01)
    *H01L 23/532* (2006.01)

(52) U.S. Cl.
    CPC .... *H01L 25/50* (2013.01); *H01L 2225/06513* (2013.01); *H01L 2225/06541* (2013.01)

(58) Field of Classification Search
    CPC ... H01L 23/5226; H01L 23/53; H01L 23/532; H01L 23/532; H01L 23/53209
    USPC ......................................................... 257/737
    See application file for complete search history.

(56) References Cited

U.S. PATENT DOCUMENTS

| | | | |
|---|---|---|---|
| 5,057,877 A | 10/1991 | Briley et al. |
| 5,156,997 A | 10/1992 | Kumar et al. |
| 5,371,328 A | 12/1994 | Gutierrez et al. |
| 5,773,875 A | 6/1998 | Chan |
| 6,108,214 A | 8/2000 | Fuse |
| 6,297,551 B1 | 10/2001 | Dudderar et al. |
| 6,324,755 B1 | 12/2001 | Borkowski et al. |
| 6,355,501 B1 | 3/2002 | Fung et al. |
| 6,396,371 B2 | 5/2002 | Streeter et al. |
| 6,436,740 B1 | 8/2002 | Jen et al. |
| 6,485,565 B1 | 11/2002 | Springer |
| 6,819,000 B2 | 11/2004 | Magerlein et al. |
| 6,825,534 B2 | 11/2004 | Chen et al. |
| 6,838,774 B2 | 1/2005 | Patti |
| 7,427,803 B2 | 9/2008 | Chao et al. |
| 7,589,390 B2 | 9/2009 | Yao |
| 7,624,088 B2 | 11/2009 | Johnson et al. |
| 7,932,515 B2 | 4/2011 | Bunyk |
| 7,939,926 B2 | 5/2011 | Kaskoun et al. |
| 8,202,785 B2 | 6/2012 | Castex et al. |
| 8,354,746 B2 | 1/2013 | Huang et al. |
| 8,466,036 B2 | 6/2013 | Brindle et al. |
| 8,487,444 B2 | 7/2013 | Law et al. |
| 8,492,911 B2 | 7/2013 | Bachman et al. |
| 8,519,543 B1 | 8/2013 | Song et al. |
| 8,546,188 B2 | 10/2013 | Liu et al. |
| 8,564,955 B2 | 10/2013 | Schmidt et al. |
| 8,736,068 B2 | 5/2014 | Bartley et al. |
| 8,754,321 B2 | 6/2014 | Schroeder et al. |
| 8,828,860 B2 | 9/2014 | Gruber et al. |
| 8,928,128 B2 | 1/2015 | Karikalan et al. |
| 8,954,125 B2 | 2/2015 | Corcoles Gonzalez et al. |
| 9,076,658 B1 | 7/2015 | Brown et al. |
| 9,171,792 B2 | 10/2015 | Sun et al. |
| 2001/0016383 A1 | 8/2001 | Chen et al. |
| 2002/0094661 A1 | 7/2002 | Enquist et al. |
| 2003/0067073 A1 | 4/2003 | Akram et al. |
| 2004/0124538 A1 | 7/2004 | Reif et al. |
| 2004/0188845 A1 | 9/2004 | Iguchi et al. |
| 2007/0087544 A1 | 4/2007 | Chang et al. |
| 2007/0207592 A1 | 9/2007 | Lu et al. |
| 2008/0093747 A1 | 4/2008 | Enquist et al. |
| 2008/0122115 A1 | 5/2008 | Popa et al. |
| 2008/0169559 A1 | 7/2008 | Yang |
| 2008/0230916 A1 | 9/2008 | Saito et al. |
| 2008/0290790 A1 | 11/2008 | Jin |
| 2009/0078966 A1 | 3/2009 | Asai et al. |
| 2009/0173936 A1 | 7/2009 | Bunyk |
| 2009/0186446 A1 | 7/2009 | Kwon et al. |
| 2009/0233436 A1 | 9/2009 | Kim et al. |
| 2010/0001399 A1 | 1/2010 | Topacio |
| 2010/0130016 A1 | 5/2010 | DeVilliers |
| 2010/0148371 A1 | 6/2010 | Kaskoun et al. |
| 2010/0171093 A1 | 7/2010 | Kabir |
| 2011/0049675 A1 | 3/2011 | Nagai et al. |
| 2011/0140271 A1 | 6/2011 | Daubenspeck et al. |
| 2011/0189820 A1 | 8/2011 | Sasaki et al. |
| 2011/0204505 A1 | 8/2011 | Pagaila et al. |
| 2011/0237069 A1 | 9/2011 | Miyazaki |
| 2011/0248396 A1 | 10/2011 | Liu et al. |
| 2012/0074585 A1 | 3/2012 | Koo et al. |
| 2012/0217642 A1 | 8/2012 | Sun et al. |
| 2012/0228011 A1 | 9/2012 | Chang et al. |
| 2012/0231621 A1 | 9/2012 | Chang et al. |
| 2012/0252189 A1 | 10/2012 | Sadaka et al. |
| 2012/0292602 A1 | 11/2012 | Guo et al. |
| 2013/0029848 A1 | 1/2013 | Gonzalez et al. |
| 2013/0093104 A1 | 4/2013 | Wu et al. |
| 2013/0099235 A1 | 4/2013 | Han |
| 2013/0147036 A1 | 6/2013 | Choi et al. |
| 2013/0153888 A1 | 6/2013 | Inoue et al. |
| 2013/0187265 A1 | 7/2013 | Shih et al. |
| 2013/0244417 A1 | 9/2013 | Markunas et al. |
| 2014/0001604 A1 | 1/2014 | Sadaka |
| 2014/0065771 A1 | 3/2014 | Gruber et al. |
| 2014/0113828 A1 | 4/2014 | Gilbert et al. |
| 2014/0246763 A1 | 9/2014 | Bunyk |
| 2014/0264890 A1 | 9/2014 | Breuer et al. |
| 2015/0041977 A1 | 2/2015 | Daubenspeck et al. |
| 2015/0054151 A1 | 2/2015 | Choi et al. |
| 2015/0054167 A1 | 2/2015 | Pendse |
| 2015/0054175 A1 | 2/2015 | Meinhold et al. |

OTHER PUBLICATIONS

International Preliminary Report dated Feb. 23, 2017 for PCT Application No. PCT/US2015/044679; 9 pages.
International Preliminary Report dated Feb. 23, 2017 for PCT Application No. PCT/US2015/044651; 10 pages.
Ohya, et al.; "Room Temperature Deposition of Sputtered TiN Films for Superconducting Coplanar Waveguide Resonators;" IOP Publishing—Superconductor Science and Technology; vol. 27, Mar. 26, 2014; 10 pages.
Tamiowy, et al.; "The Effect of Thermal Treatment on the Structure, Optical and Electrical Properties of Amorphous Titanium Nitride Thin Films;" Thin Solid Films 311; 1997; 8 pages.
PCT Search Report of the ISA for PCT/US2016/052824 dated Feb. 3, 2017; 6 pages.
PCT Written Opinion of the ISA for PCT/US2016/052824 dated Feb. 3, 2017; 6 pages.
PCT Search Report of the ISA for PCT/US2016/043266 dated Dec. 5, 2016; 5 pages.
PCT Written Opinion of the ISA for PCT/US2016/043266 dated Dec. 5, 2016; 9 pages.
Office Action dated Mar. 3, 2017 for U.S. Appl. No. 14/694,540; dated 16 pages.
Office Action dated Mar. 24, 2017 for U.S. Appl. No. 15/303,800, 39 pages.
PCT Search Report of the ISA for PCT/US2016/060296 dated Mar. 19, 2017; 5 pages.
PCT Written Opinion of the ISA for PCT/US2016/060296 dated Mar. 10, 2017; 5 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, filed May 19, 2017; 6 pages.
Restriction Requirement dated May 16, 2017 for U.S. Appl. No. 15/327,249; 6 pages.

(56) References Cited

OTHER PUBLICATIONS

PCT International Preliminary Report on Patentability dated May 18, 2017 for PCT Appl. No. PCT/US2015/059181; 11 pages.
PCT International Preliminary Report on Patentability dated May 18, 2017 for PCT Appl. No. PCT/US2015/059200; 11 pages.
U.S. Appl. No. 15/303,800, filed Oct. 13, 2016, Das, et al.
U.S. Appl. No. 15/312,063, filed Nov. 17, 2016, Das, et al.
U.S. Appl. No. 14/694,540, filed Apr. 23, 2015, Das, et al.
U.S. Appl. No. 15/271,755, filed Sep. 21, 2016, Das.
U.S. Appl. No. 15/342,478, filed Nov. 3, 2016, Oliver, et al.
U.S. Appl. No. 15/342,589, filed Nov. 3, 2016, Oliver, et al.
U.S. Appl. No. 15/342,444, filed Nov. 3, 2016, Oliver, et al.
U.S. Appl. No. 15/342,517, filed Nov. 3, 2016, Oliver, et al.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
PCT Search Report of the ISA for PCT Appl. No. PCT/US2015/044651 dated Nov. 4, 2015; 3 pages.
PCT Written Opinion of the ISA for PCT Appl. No. PCT/US2015/044651 dated Nov. 4, 2015; 12 pages.
PCT Search Report of the ISA for PCT Appl. No. PCT/US2016/060263 dated Jan. 10, 2017; 3 pages.
PCT Written Opinion of the ISA for PCT Appl. No. PCT/US2016/060263 dated Jan. 10, 2017; 6 pages.
Burns, et al.; "3D Circuit integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2012; 2 pages.
International Search Report of the ISA for PCT Appl. No. PCT/US2016/060343 dated Jul. 18, 2017; 3 pages.
International Written Opinion of the ISA for PCT Appl. No. PCT/US2016/060343 dated Jul. 18, 2017; 12 pages.
Notice of Allowance for U.S. Appl. No. 14/694,540 dated Jul. 31, 2017, 9 pages.
Notice of Allowance for U.S. Appl. No. 15/312,063 dated Aug. 2, 2017, 17 pages.
Office Action dated Jul. 7, 2017 for U.S. Appl. No. 15/271,755; 26 pages.
Response to Office Action dated Mar. 3, 2017 for U.S. Appl. No. 14/694,540, filed Jun. 1, 2017; 24 pages.
Response to Office Action dated Mar. 24, 2017 for U.S. Appl. No. 15/303,800, filed Jun. 26, 2017; 22 pages.
Response to Restriction Requirement dated May 16, 2017 for U.S. Appl. No. 15/327,249, filed Jun. 27, 2017; 1 page.
Response to Restriction Requirement dated Jun. 8, 2017 for U.S. Appl. No. 15/271,755, filed Jun. 19, 2017; 1 page.
Office Action dated Aug. 11, 2017 for U.S. Appl. No. 15/342,444; 22 pages.

INTERCONNECT STRUCTURES FOR ASSEMBLY OF MULTI-LAYER SEMICONDUCTOR DEVICES

CROSS REFERENCE TO RELATED APPLICATIONS

This application is a U.S. National Stage of PCT application PCT/US2015/044608 filed in the English language on Aug. 11, 2015, and entitled "INTERCONNECT STRUCTURES FOR ASSEMBLY OF MULTI-LAYER SEMICONDUCTOR DEVICES," which claims the benefit under 35 U.S.C. §119 of provisional application No. 62/035,713 filed Aug. 11, 2014, which application is hereby incorporated herein by reference.

GOVERNMENT RIGHTS

This invention was made with government support under Contract No. FA8721-05-C-0002 awarded by the U.S. Air Force. The government has certain rights in the invention.

FIELD

This disclosure relates generally to multi-layer semiconductor devices, and more particularly, to semiconductor interconnect structures which enable assembly of multi-layer semiconductor devices including at least two semiconductor structures.

BACKGROUND

As is known in the art, there is trend toward miniaturization of electronic products such as mobile phones, tablets, digital cameras, and the like. Consequently, there has been a trend in semiconductor device manufacturing towards smaller and more densely packed semiconductor structures. This has resulted in a demand for semiconductor packages which are relatively low loss, lightweight structures and which support increased electronic capabilities (e.g., increased density, mobility and extended operational life) in miniaturized electronic products demanded by both military and commercial customers alike.

The foregoing trend and demand, drives a need for multi-layer semiconductor devices, semiconductor devices including at least two semiconductor structures. The foregoing trend and demand also drives a need for interconnect structures which enable assembly of multi-layer semiconductor devices.

SUMMARY

Described herein are concepts, systems, circuits and techniques related to a semiconductor interconnect structure (i.e., a via joining layer) suitable for electrically and mechanically coupling at least two semiconductor structures together to form a multi-layer semiconductor device including the at least two semiconductor structures. The present disclosure further describes circuits and techniques for fabricating multi-layer semiconductor devices including at least two semiconductor structures.

In one aspect of the concepts described herein, a multi-layer semiconductor device includes at least two semiconductor structures with each of the at least two semiconductor structures having first and second opposing surfaces and including a first section having first and second opposing surfaces and a plurality of electrical connections extending between select portions of the first and second surfaces. The first surface of the first section corresponds to the first surface of the at least two semiconductor structures. Additionally, each of the at least two semiconductor structures includes a second section having first and second opposing surfaces. The first surface of the second section is disposed over and coupled to the second surface of the first section.

The second section includes a device layer having first and second opposing surfaces and a plurality of electrical connections extending between the first and second surfaces. The second surface of the device layer corresponds to the second surface of the second section. The second section also includes an insulating layer having first and second opposing surfaces. The first surface of the insulating layer corresponds to the first surface of the second section. Each of the at least two semiconductor structures additionally include one or more conductive structures extending between select ones of the plurality of electrical connections in the first section, select ones of the plurality of electrical connections in the device layer of the second section, and select portions on or beneath the second surface of each of the at least two semiconductor structures.

Each of the at least two semiconductor structures further include one or more interconnect pads having first and second opposing surfaces and one or more sides. The first surface of each one of the interconnect pads is disposed over or beneath select portions of at least the second surface of each of the at least two semiconductor structures and select ones of the one or more interconnect pads are electrically coupled to the one or more conductive structures.

The multi-layer semiconductor device also includes a via joining layer disposed between and coupled to second surfaces of each of the at least two semiconductor structures. The via joining layer has first and second opposing surfaces and at least one conductive structure extending between select portions of the first and second surfaces. The at least one conductive structure is electrically coupled to second surfaces of select ones of the one or more interconnect pads on the at least two semiconductor structures to form one or more electrical connections between the at least two semiconductor structures.

The multi-layer semiconductor device may include one or more of the following features individually or in combination with other features. At least one of the one or more electrical connections formed between the at least two semiconductor structures may be an electrical connection between select ones of the plurality of electrical connections in the first section of a first one of the at least two semiconductor structures and select ones of the plurality of electrical connections in the first section of a second one of the at least two semiconductor structures. A predetermined distance of between about one micrometer (μm) and about four μm may exist between the first and second surfaces of the via joining layer. The predetermined distance may correspond to a height of the via joining layer and a height of the at least one conductive structure. A predetermined distance of between about six micrometers (μm) and about ten μm may exist between the first and second surfaces of the second section in a first one of the at least two semiconductor structures. The predetermined distance may correspond to a height of the second section.

The multi-layer semiconductor device may also include one or more of the following features individually or in combination with other features. The at least one conductive structure in the via joining layer may include a plurality of conducting metals, the plurality of metals including at least one of Nickel (Ni), Copper (Cu), Aluminum (Al), Zinc (Zn)

and Tin (Sn). The via joining layer may include an oxide material. The second section of a first one of the at least two semiconductor structures may include a first conductive structure of the one or more conductive structures. The first conductive structure may have first and second opposing surfaces extending between the first and second surfaces of the second section of the first one of the at least two semiconductor structures. The first surface of the first conductive structure may have first dimensions and the second surface of the first conductive structure may have second, different dimensions. The first surface of the first conductive structure may have a diameter between about two µm and about three µm. The second surface of the first conductive structure may have a diameter between about two µm and about three µm.

The multi-layer semiconductor device may additionally include one or more of the following features individually or in combination with other features. At least one of the one or more conductive structures extending between select ones of the plurality of electrical connections in the first section and select ones of the plurality of electrical connections in the device layer of the second section may be provided as a through insulator via (TIV) conductive structure. The insulating layer of the second section may be provided from an oxide material including at least one of silicon dioxide ($SiO_2$) and chemically treated silicon oxide (SiO), wherein the SiO is chemically treated through a chemical vapor deposition process. At least one of the one or more conductive structures extending between select ones of the plurality of electrical connections in the first section and select ones of the plurality of electrical connections in the device layer of the second section may be provided as a through oxide via (TOV) conductive structure.

The multi-layer semiconductor device may further include one or more of the following features individually or in combination with other features. The device layer of the second section may further include one or more circuit components disposed between the first and second surfaces of the device layer. The one or more circuit components may be electrically coupled to select ones of the plurality of electrical connections. The device layer of the second section may include an oxide material which is deposited over the second surface of the insulating layer. At least the second section may be fabricated using Silicon-On-Insulator (SOI) fabrication techniques. The first section may be fabricated using either SOI or bulk complementary metal-oxide semiconductor (CMOS) fabrication techniques. The first section and the second section may be substantially the same. A first one of the at least two semiconductor structures may be provided having a first form factor and a second one of the at least two semiconductor structures may be provided having a second different, form factor. The multi-layer semiconductor device may be integrated into a communications device.

The multi-layer semiconductor device may also include one or more of the following features individually or in combination with other features. At least one of the at least two semiconductor structures may further include a third section having first and second opposing surfaces. The first surface of the third section may be disposed over and coupled to the first surface of the second section. The third section may include a device layer having first and second opposing surfaces and a plurality of electrical connections extending between the first and second surfaces. The second surface of the device layer may correspond to the second surface of the third section. The third section may also include an insulating layer having first and second opposing surfaces. The first surface of the insulating layer may correspond to the first surface of the third section. At least one of the one or more conductive structures in the at least one of the at least two semiconductor structures may extend between select ones of the plurality of electrical connections in the device layer of the second section, select ones of the plurality of electrical connections in the device layer of the third section, and select portions on or beneath the second surface of the at least one of the at least two semiconductor structures.

In one aspect of the concepts described herein, a method for fabricating a multi-layer semiconductor device includes providing at least two semiconductor structures. Each of the at least two semiconductor structures have first and second opposing surfaces and include a first section having first and second opposing surfaces and a plurality of electrical connections extending between select portions of the first and second surfaces. The first surface of the first section corresponds to the first surface of the at least two semiconductor structures.

Each of the at least two semiconductor structures also include a second section having first and second opposing surfaces. The first surface of the second section is disposed over and coupled to the second surface of the first section. The second section includes a device layer having first and second opposing surfaces and a plurality of electrical connections extending between the first and second surfaces. The second surface of the device layer corresponds to the second surface of the second section. The second section also includes an insulating layer having first and second opposing surfaces. The first surface of the insulating layer corresponds to the first surface of the second section.

Each of the at least two semiconductor structures additionally include one or more conductive structures extending between select ones of the plurality of electrical connections in the first section, select ones of the plurality of electrical connections in the device layer of the second section, and select portions on or beneath the second surface of each of the at least two semiconductor structures. Each of the at least two semiconductor structures further include one or more interconnect pads having first and second opposing surfaces and one or more sides. The first surface of each one of the interconnect pads is disposed over or beneath select portions of at least the second surface of each of the at least two semiconductor structures and select ones of the one or more interconnect pads are electrically coupled to the one or more conductive structures.

The method also includes forming a first via joining layer on the second surface of a first one of the at least two semiconductor structures. The first via joining layer has first and second opposing surfaces and at least one conductive structure extending between select portions of the first and second surfaces. The first surface of the first via joining layer is disposed over the second surface of the first one of the at least two semiconductor structures and the at least one conductive structure is electrically coupled to second surfaces of select ones of the one or more interconnect pads on the first one of the at least two semiconductor structures. The method additionally includes coupling the second surface of the first via joining layer to the second surface of a second one of the at least two semiconductor structures to form one or more electrical connections between the first and second ones of the at least two semiconductor structures.

The method may include one or more of the following features either individually or in combination with other features. Coupling the second surface of the first via joining layer to the second surface of a second one of the at least two semiconductor structures may include forming a second via joining layer on the second surface of a second one of the at least two semiconductor structures. The second via joining layer may have first and second opposing surfaces and at least one conductive structure extending between select portions of the first and second surfaces. The first surface of the second via joining layer may be disposed over the second surface of the second one of the at least two semiconductor structures and the at least one conductive structure may be electrically coupled to second surfaces of select ones of the one or more interconnect pads on the second one of the at least two semiconductor structures.

Coupling the second surface of the first via joining layer to the second surface of a second one of the at least two semiconductor structures may also include coupling the second surface of the first via joining layer to the second surface of a second via joining layer to form one or more electrical connections between the first and second ones of the at least two semiconductor structure structures.

The method may also include one or more of the following features either individually or in combination with other features. Coupling the second surface of the first via joining layer to the second surface of the second via joining layer may include planarizing the second surface of the first via joining layer, planarizing the second surface of the second via joining layer, and coupling the second surface of the first via joining layer to the second surface of a second via joining layer to form one or more electrical connections between the first and second ones of the at least two semiconductor structure structures.

The method may additionally include one or more of the following features either individually or in combination with other features. Coupling the second surface of the first via joining layer to the second surface of the second via joining layer may include aligning the second surface of the first via joining layer with the second surface of the second via joining layer such that the second surfaces of the first and second via joining layers are substantially parallel to each other and spaced apart from each other by a predetermined separation distance, and such that at least a first one of the at least one conductive structure of the first via joining layer is aligned with the at least a first one of the at least one conductive structure of the second via joining layer.

Coupling the second surface of the first via joining layer to the second surface of the second via joining layer may also include coupling the second surface of the first via joining layer to the second surface of the second via joining layer such that at least the first ones of the conductive structures in the first and second via joining layers are electrically coupled to each other to form one or more electrical connections between the first and second ones of the at least two semiconductor structure structures.

The method may further include one or more of the following features either individually or in combination with other features. Forming a first via joining layer on the second surface of a first one of the at least two semiconductor structures may include applying a conductive layer having first and second opposing surfaces. The first surface of the conductive layer may be disposed over select portions of the second surface of the first one of the at least two semiconductor structures. Forming the first via joining layer may also include applying a photo resist layer having first and second opposing surfaces. The first surface of the photo resist layer may be disposed over the second surface of the conductive layer and second surfaces of the one or more interconnect pads of the first one of the at least two semiconductor structures.

Forming the first via joining layer may additionally include exposing the photo resist layer to an exposure energy having a predetermined intensity distribution such that openings having a predetermined shape are formed in select portions of the photo resist layer extending between the second surface of the photo resist layer and second surfaces of select ones of the one or more interconnect pads. Forming the first via joining layer may further include disposing a conductive material in the openings formed in the select portions of the photo resist layer. Forming the first via joining layer may also include forming one or more conductive structures having first and second opposing surfaces from the conductive material. The first surface of each one of the one or more conductive structures may be electrically coupled to second surfaces of the select ones of the one or more interconnect pads and the second surface of each one of the one or more conductive structures may extend a predetermined distance above the second surface of the first one of the at least two semiconductor structures. Forming the first via joining layer may additionally include removing remaining portions of the photo resist layer to form openings between each of the one or more conductive structures.

Forming the first via joining layer may further include removing select portions of the conductive layer. Forming the first via joining layer may also include disposing an oxide material in at least the openings formed between each of the one or more conductive structures. Forming the first via joining layer may additionally include forming one or more insulating structures having first second opposing surfaces from the oxide material. The first surface of each of the one or more insulating structures may be coupled to at least the second surface of the first one of the at least two semiconductor structures and the second surface of each of the one or more insulating structures may extend the predetermined distance above the second surface of the first one of the at least two semiconductor structures. First surfaces of the one or more conductive structures and the one or more insulating structures may correspond to a first surface of the first via joining layer and second surfaces of the one or more conductive structures and the one or more insulating structures may correspond to a second, opposing surface of the first via joining layer.

BRIEF DESCRIPTION OF THE DRAWINGS

Features and advantages of the concepts, systems, circuits and techniques disclosed herein will be apparent from the following description of the embodiments taken in conjunction with the accompanying drawings in which:

FIGS. 3-3A are block diagrams of example semiconductor structures,

FIG. 3B is a block diagram of an example multi-layer semiconductor device including the semiconductor structures of FIGS. 3-3A, for example;

DETAILED DESCRIPTION

Figure 1:
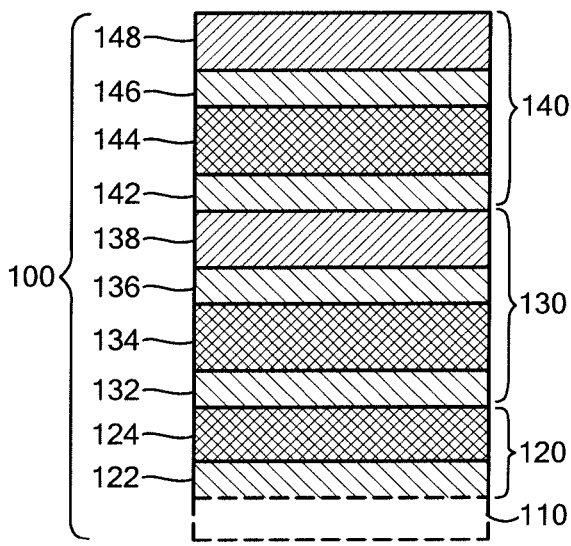
FIGS. 1-1A are block diagrams of example semiconductor structures.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views.

Definitions

For convenience, certain introductory concepts and terms used in the specification are collected here.

As used here, the term "chemically activated surface" is used to describe a surface which is minimally etched and/or damaged. The hydrophilicity or hydrophobicity of the surface may be changed with appropriate plasma and/or chemical treatment by changing or modifying surface chemistry.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or during post bonding annealing or reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (µm) and about one-hundred fifty µm's and a sub-micron via having a diameter of less than about one µm.

As used herein, the term "device layer" is used to describe a single or multilayer structure including a number of active or passive semiconductor components, the structure capable of performing at least part of the functional operations (i.e., semiconductor system performance) of a semiconductor structure. Device layers are typically fabricated separately on Silicon on insulator (SOI) substrates or bulk Silicon (Si) substrates. Additionally, each device layer may include at least one interconnect and one or more of active Si, Gallium nitride (GaN) and III-V field-effect transistors (FETs).

As used herein, the term "electronic device" is used to describe an integrated circuit (IC) device (e.g., a semiconductor chip).

As used herein, the term "interposer" is used to describe an interconnect structure capable of electrically coupling two or more semiconductor structures together.

As used herein, the term "module" is used to describe an electrical component having a substrate (e.g., a silicon substrate or printed circuit board (PCB)) on which at least one semiconductor device is disposed. The module may include a plurality of conductive leads adapted for coupling the module to electrical circuitry and/or electrical components located externally of the module. One known example of such a module is a Multi-Chip Module (MCM), such modules coming in a variety of shapes and forms. These can range from pre-packaged chips on a PCB (to mimic the package footprint of an existing chip package) to fully custom chip packages integrating many chips on a High Density Interconnection (HDI) substrate.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit or digital circuit.

As used herein, the term "self-bondable oxide" is used to describe multilayer oxide (e.g., single or multi component, doped or undoped, high density-low density, etc.), the multilayer oxide having at least one chemically activated, ultrasmooth bonding surface (e.g., within a predetermined number of angstroms (Å)) capable of bonding with another self-bondable oxide without any external force. The process for bonding a first self-bondable oxide with a second self-bondable oxide, etc. requires minimum force to activate bonding at a symmetry point on a bonding surface of the first and second self-bondable oxides (e.g. wafers), and little to no additional force to self-propagate bonding to entire surfaces of the first and second self-bondable oxides. Self-bondable oxides preferably use an oxidizing-reducing agent to chemically activate a bonding surface. RCA and/or high frequency (HF) and/or mega sonic cleaning and/or Plasma (e.g. oxygen) and/or Ammonium Hydroxide may be used for pre-bond surface treatments for the self-bondable oxide. Additionally, annealing the self-bondable oxide at a temperature between about one-hundred fifty degrees Celsius (C) and about five-hundred degrees C. in presence of Hydrogen (H) or Nitrogen (N) may increase bond strength of the self-bondable oxide.

As used herein, the term "substrate" is used to describe any structure upon which an integrated circuit or semiconductor device can be disposed or upon which semiconductor materials can be deposited and/or into which semiconductor materials can be implanted and diffused to form a semiconductor structure or device, for example. In some embodiments, the substrate may be provided as a P-type substrate (i.e., a substrate) having a particular range of concentrations of P-type atoms (i.e., ions). In other embodiments an N-type substrate may be used (i.e., a substrate having a particular range of concentration of N-type atoms).

The substrate may, for example, be provided from a semiconductor material, an insulator material or even a conductor material. For example, the substrate may be provided from silicon, alumina, glass or any other semiconductor material. Further, the substrate can include a number of metal-oxide-silicon (MOS) devices, complementary-MOS (CMOS) devices, or a number of active or passive integrated circuit semiconductor devices.

As used herein, the term "three-dimensional (3-D) integrated circuit (IC)" is used to describe a semiconductor structure including at least two device layers (e.g., which are vertically stacked) and interconnects (e.g., vertical interconnects) to make one or more electrical connections between the device layers.

As used herein, the term "through oxide via (TOV)" is used to describe a via (e.g., micro via) in a semiconductor structure used to connect adjacent device layers. The TOV passes through one or more oxide, dielectric, and/or metal layers and terminates at a predetermined Silicon (Si) layer or surface.

As used herein, the term "via first" may be used to describe a micro via and/or a submicro via used to make at least one electrical connection between a first device layer and second device layer in a semiconductor structure including at least two device layers. Additionally, as described here, the term "via" first may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via first process, the first device layer and the second device layer are completed separately. As one example, a partial via material is added on first and/or second opposing surfaces (i.e., top and/or bottom surfaces) of the first second device layers and subsequent bonding and/or post bonding process create a via first between the first and second device layers.

The via first may be filled with at least one metal or alloy having a high Coefficient of Thermal Expansion (CTE) to produce a rigid, robust, and conductive via first joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via first may be filled with a low temperature fusible metal which melts and interdiffuse during bonding or post bonding processes.

As used herein, the term "via last" is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via last process. A pad layer which includes one or more interconnect pads may be added after via last process. In one embodiment, via last is filled. Additionally, in one embodiment, the via last can be unfilled or partially filled. Via last may pass through the device layers (e.g., second device layers) and, in some embodiments, one or more isolation layers or materials. A titanium (Ti) material having a thickness of about ten nanometers (nm) and, a metal organic chemical vapor deposition (MOCVD) Titanium Nitride (TiN) liner having a thickness of about five nm, and tungsten plugs may be used for via lasts. A MOCVD or chemical vapor deposition (CVD) $TiN_X$, with X less than or equal to 1, is preferred for better conformal coating.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (μm) opening that also functions as a self-aligned mask (e.g., hard mask) during the plasma etch of the oxide beneath it to reach a corresponding metal contact in a lower device layer (e.g., the first device layer). In order to fully dispose and electrically the via, the size of the metal contacts, and thus the pitch of the vertical interconnect, is made proportional to about twice the wafer-wafer misalignment of the wafers including the first and second device layers.

While multi-layer semiconductor devices including two semiconductor structures are described in several examples below, two semiconductor structures are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using more than two semiconductor structures.

Additionally, while multi-layer semiconductor devices including semiconductor structures which are the same as or similar to each other are described in several examples below, such are discussed to promote simplicity, clarity and understanding in the drawings as well as in the written description of the broad concepts, systems, circuits and techniques sought to be protected herein and is not intended to be, and should not be construed, as limiting. The concepts, systems, circuits and techniques disclosed herein may, of course, be implemented using semiconductor structures which are different from each other.

Moreover, it should, of course, be appreciated that elements shown in the figures are not necessarily drawn to scale. For example, the dimensions of some elements may be exaggerated relative to other elements for clarity. Further, where considered appropriate, same or similar reference designators have been repeated among the figures to indicate corresponding or analogous elements.

Referring now to FIG. 1, an example semiconductor structure 100 as may be provided as part of an example multi-layer semiconductor device (e.g., semiconductor device 2100, as will be discussed) including at least two semiconductor structures is shown. The semiconductor structure 100 has first and second opposing surfaces and includes a plurality of sections (here, three sections). Each of the three sections includes a plurality of layers (e.g., insulating and device layers, as will be discussed). The semiconductor structure 100 also includes a support or "handle" structure (e.g., a handle substrate) 110 having first and second opposing surfaces. The second surface of the handle structure 110 is disposed over and coupled to the first surface of the semiconductor structure 100. The handle structure 110 is optional in some embodiments and is thus shown in phantom in FIG. 1. Additionally, the handle structure 110 may be provided as part of or separate from the semiconductor structure 100 in some embodiments.

In the example embodiment shown, a first one of the plurality of sections (also sometimes referred to herein as a "first section") 120 has first and second opposing surfaces and includes an insulating layer 122 and a device (or "functional") layer 124. The insulating layer 122, which is provided from one or more electrically-insulating materials (e.g., bondable oxide, re-workable oxide, seamless oxide, etch-stoppable oxide), has first and second opposing surfaces with the first surface corresponding to the first surface of the first section. The device layer 124, which is provided from materials including at least one of Silicon (Si) (e.g., a Silicon material which is sensitive to an electric field, a magnetic field, radio-frequency (RF) energy, microwave energy, and/or light energy), Polysilicon, Graphene, Gallium arsenide (GaAs), Gallium nitride (GaN) and Cobalt Silicide (Co-Silicide), has first and second opposing surfaces with the second surface corresponding to the second surface of the second section. The first surface of the device layer 124 is disposed over the second surface of the insulating later 122.

The device layer 124 includes one or more circuit components, devices and modules (e.g., resistors, capacitors, transistors, inductors, integrated circuits) (not shown), each of which may be passive or active, for example, disposed between the first and second surfaces of the device layer 124, as will be discussed. The circuit components, device, and modules may be electrically coupled to select electrical connections (not shown) and conductive planes (not shown) in the first section (e.g., through one or more conductive structures, as will be discussed).

A second one of the plurality of sections (also sometimes referred to herein as a "second section") 130 has first and second opposing surfaces and includes a first insulating layer 132, a device layer 134, a second insulating layer 136 and an interconnect layer 138 (e.g., for electrically coupling first section 120 and second section 130, including device layer 134 of second section 130, as will be discussed). The second insulating layer 136 and/or the interconnect layer 138 may be provided as part of or separate from the device layer 134 in some embodiments. First insulating layer 132, which may be the same as or similar to insulating layer 122, has first and second opposing surfaces with the first surface corresponding to the first surface of the second section. The first surface of the second section is disposed over and coupled to the second surface of the first section.

Device layer 134, which may be the same as or similar to the device layer 124, has first and second opposing surfaces with the first surface disposed over and coupled to the second surface of the first insulating layer 132. The second insulating layer 136, which has first and second opposing surfaces, is provided from one or more electrically-insulating materials (e.g., etch-stoppable oxide materials such as Silicon Oxide ($SiO_x$)). The first surface of the second insulating layer 136 is disposed (or deposited) over and coupled to the first surface of the device layer 134. Interconnect layer 138 has first and second opposing surfaces with the first surface disposed over the second surface of the second insulating layer 136. Interconnect layer 138 is electrically coupled to select ones of the electrical connections in at least the device layer 134 of the second section 130. In one embodiment, interconnect layer 138 electrically couples first section 120 and second section 130 together. Interconnect layer 138 can also be used to connect device layer 134. Interconnect layer 138 may, for example, connect micron range (1 micron or above) via, sub-micron range (0.99-0.1 micron) and/or nano range (less than 0.1 micron) vias. One possible combination for at least part of interconnect layer 138 is first micro via-single or multiple sub-micro via-second micro via connected through a pad. Part of interconnect layer 138 can be first micro via-first single or multiple sub-micro via-single or multiple nano via-second single or multiple sub-micro via-second micro via. Additionally, in one embodiment, interconnect layer 138 further extends to and is electrically coupled with an interconnect layer 148, as will be discussed.

A third one of the plurality of sections (also sometimes referred to herein as a "third section") 140, which is similar to the second section in the example embodiment shown, has first and second opposing surfaces and includes a first insulating layer 142, a device layer 144, a second insulating layer 146 and an interconnect layer 148. The first surface of the third section 140 is disposed over the second surface of the second section 130.

In one embodiment, at least part of the first insulating layer 142 and/or the second insulating layer 146 has a multilayer structure. Insulating layers 142, 146 can include a first high density oxide portion, a low density oxide portion, and a second high density oxide portion. Insulating layers 142, 146 can additionally or alternatively include a thermal oxide portion, a plasma enhanced CVD oxide portion, and a second thermal oxide portion. Insulating layers 142, 146 can additionally or alternatively include a first high density oxide portion, a chemically activated low density oxide portion, and a second high density oxide portion.

Additionally, in one embodiment, the first insulating layer 142 and/or the second insulating layer 146 can include a standard and/or low pressure silane oxide and/or a high power plasma enhanced chemical vapor deposition (PECVD) oxide. Further, at least part of the insulating layers 142, 146 may include an oxide layer which is capable of self-bonding with another oxide layer with minimum or no force activation (e.g., a self-bondable oxide). Moreover, in one embodiment, a semiconductor structure including "n" number of device layers requires at least "n−1" self-bondable oxide layers and "n−1" oxide/insulating layers.

Insulating layers 142, 146 can have a single oxide layer or multiple oxide layers having same or similar densities. Additionally, annealing insulating layers 142, 146 and subsequently adding a PECVD oxide to insulating layers 142 may neutralize stress and increase bond strength of insulating layers 142, 146. Although in some embodiments it is preferable to use oxide as an etch stop insulating layer for the silicon of active devices in device layers (e.g., 124, 134, 144), in other embodiment other suitable insulating materials capable of stop selective Si etching can be used instead of oxide. Interconnect layers 138, 148 are patterned and etched through the insulating layers (e.g., 142, 146) and deposited oxides to expose metal contacts in semiconductor structure 100 (and 1000, as will be discussed). 3-D vias (e.g., 2110, as will be discussed) are created during bonding of semiconductor structure 100 and one or more other semiconductor structures (e.g., 1100) in one or more regions (e.g., isolation regions) between the device layers of the semiconductor structure 100 and the other semiconductor structure(s).

In some embodiments, at least second section 130 of semiconductor structure 100 is fabricated using Silicon-On-Insulator (SOI) fabrication techniques. Additionally, in some embodiments, at least first section 120 of semiconductor structure 100 is fabricated using SOI or bulk complementary metal-oxide semiconductor (CMOS) fabrication techniques. Further, in some embodiments, the first section 120 and the second section 130 are substantially the same. Additionally, in some embodiments, two or more of the first section 120, the second section 130 and the third section 140 are substantially the same.

Figure 1B:
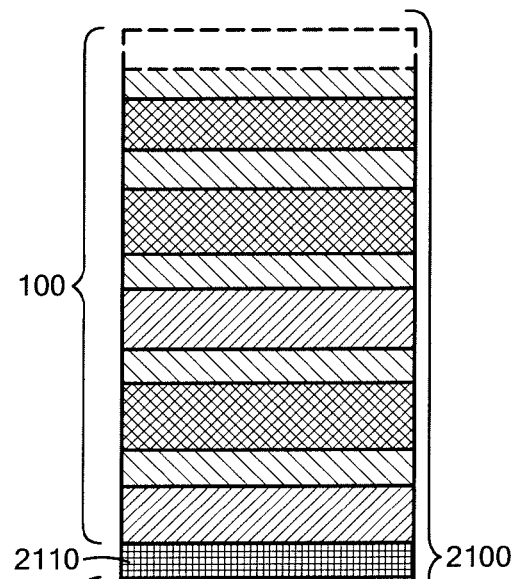
FIG. 1B is a block diagram of an example multi-layer semiconductor device including the semiconductor structures of FIGS. 1-1A, for example.
Figure 1A:
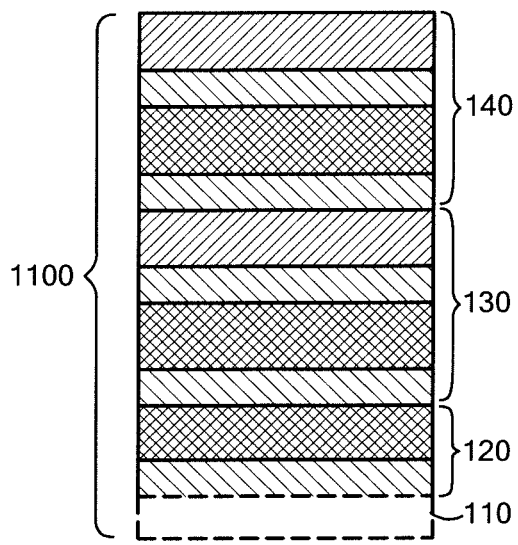

Referring now to FIG. 1A, in which like elements of FIG. 1 are shown having like reference designations, another example semiconductor structure 1100 as may be provided as part of an example semiconductor device including at least two semiconductor structures (e.g., semiconductor device 2100, as will be discussed) is shown. The semiconductor structure 1100 includes a first section 120, a second section 130, a third section 140 and an optional handle structure 110.

Referring now to FIG. 1B, an example multi-layer semiconductor device 2100 as may be provided in an example method for fabricating a semiconductor device including at least two semiconductor structures (here, semiconductor structure 100 and semiconductor structure 1100 of FIGS. 1 and 1A, respectively) in accordance with the concepts, systems, circuits and techniques sought to be protected herein is shown.

The semiconductor device 2100 includes semiconductor structure 100, semiconductor structure 1100, and a via joining layer (or semiconductor interconnect structure) 2110 disposed between and coupled to second surfaces of each of the semiconductor structure 100 and semiconductor structure 1100. The via joining layer 2110 electrically couples select portions of semiconductor structure 100 and semiconductor structure 1100 to form one or more electrical connections between semiconductor structure 100 and semiconductor structure 1100, and to form the semiconductor device 2100.

In one embodiment, multiple oxide layers (not shown) are further deposited on one or more surfaces (e.g., first and/or second surfaces) of at least one of semiconductor structure 100 and semiconductor structure 1100. These oxide layers can include at least one of a low temperature oxide (LTO), Phosphosilicate glass (PSG), Borosilicate Oxide (BSG). As one example, these oxide layers can be arranged to include LTO-PSG-LTO, PSG-LTO-PSG, LTO-BSG-LTO, BSG-LTO-BSG, LTO-BSG-PSG, each stacked on top of the other. Additionally, in one embodiment, a Chemical-mechanical planarization (CMP) may be applied before and/or after deposition of a self-bondable oxide on one or more surfaces of the one or more oxide layers (e.g., the multiple oxide layer stack). Annealing the self-bondable oxide at a temperature between about one-hundred fifty degrees C. and about five-hundred degrees C. in presence of Hydrogen or nitrogen may increase bond strength (e.g., >1500 mJ/m$^2$), lower void formation (<10%), and improve alignment of the self-bondable oxide.

Additionally, in one embodiment, multiple CMP processes are applied before and/or after deposition of the self-bondable oxide. As one example, a CMP process may be applied after each annealing step. The CMP may, for example, create angstrom level surface roughness (e.g., on surfaces having macro/extrinsic voids caused by particles, scratches and micro/intrinsic voids caused by bond by-products coalescing). In one embodiment, semiconductor structure 100 and semiconductor structure 1100 are Notch aligned with less than about a two-hundred fifty μm iW capture window and patterned wafer to wafer aligned with less than an about one μm (e.g., 0.75 um) window.

Further, in one embodiment, an oxide material or layer (e.g., thermal oxide) may deposited on one or more surfaces (e.g., first and/or second surfaces) of at least one of semiconductor structure 100 and semiconductor structure 1100 before bonding. In one embodiment, the oxide material or layer can be applied to both first and second surfaces of semiconductor structure 100 and semiconductor structure 1100 (e.g., for optimal infrared alignment). Additionally, in one embodiment, at least semiconductor structure 100 has the oxide layer or material on a single surface (e.g., a first surface) and semiconductor structure 1100 has the oxide material or layer on both first and second surfaces.

The oxide deposition described above, and subsequent polishing of the oxide layer or material, may provide for wafer to wafer infrared alignment of less than about one μm (e.g., 0.75 um). Semiconductor structures 100, 1100 may be precision aligned to sub-micron accuracy using infrared cameras, for example, to look directly through a first one of the semiconductor structures. Semiconductor structures 100, 1100 may also be bonded by initiating contact at the center of the semiconductor structure 100, for example.

In some embodiments, at least one of semiconductor structure 100 and semiconductor structure 1100 of semiconductor device 2100 may include or be provided as part of a multi-layer semiconductor structure (also commonly referred to as a three-dimensional (3-D) integrated circuit (IC)), for example, a semiconductor structure in which a number of individual semiconductor structures are both mechanically and electrically coupled. One example multi-layer semiconductor structure is described in U.S. Pat. No. 7,067,909 entitled "Multi-layer integrated semiconductor structure having an electrical shielding portion," which is assigned to the assignee of the present disclosure and incorporated herein by reference in its entirety. Another example multi-layer semiconductor structure is described in co-pending U.S. patent application Ser. No. 14/694,540 entitled "Interconnect Structures For Fine Pitch Assembly Of Semiconductor Structures," which is also assigned to the assignee of the present disclosure and incorporated herein by reference in its entirety.

Further, in some embodiments, the multi-layer semiconductor device 2100 of FIG. 1B discussed above and one or more of the multi-layer semiconductor devices of FIGS. 2-6F discussed below may include or be provided as part of a system such as a telecommunication system (e.g., in a handset or base station) or an information technology system or a circuit such as a filter circuit (e.g., a tunable radio-frequency (RF) filter circuit), for example, with a semiconductor structure (e.g., semiconductor structure 100) including a plurality of sections (or layers). In implementing a filter circuit, for example, a first one of the sections may include a first resonator circuit, a second one of the sections ma include a second resonator circuit, a third one of the sections may include a third resonator circuit and so on. The resonator circuits may, for example, be combinable to provide a filter circuit having a multi-octave response characteristic. The filter circuit of the multi-layer semiconductor device may be integrated into a communications device.

The concepts, systems, circuits and techniques sought to be protected herein provide novel methods and structures for producing multi-layer hybrid three dimensional IC (3DIC) structures (e.g., 2100, as shown in FIG. 1B). Specifically, the methods and structures provide means for converting via last in an interconnect layer (e.g., 148, as shown in FIG. 1) to via first (e.g., 2110, as shown in FIG. 1B) to create an electrical interconnection among at least two semiconductor structures (e.g., 100, 1100, as shown in FIG. 1B). Interconnects are formed in a via joining layer (e.g., 2110, as shown in FIG. 1B) during bonding of self-bondable oxide using at least one of an electrically conductive high CTE metal, an electrically conductive low CTE metal, and a fusible metal or alloys. As a result, one is able to fabricate semiconductor structures and devices with multiple heterogeneous elements at any arbitrary device layer (e.g., 134, as shown in FIG. 1) of the semiconductor structures. Minimum structural configurations are need for the semiconductor structures (e.g., 100, 1100) to create the conversion of via last to via first. In one embodiment, at least one of the semiconductor structures (e.g., 100, 1100) needs to have via last or two device layers. For example, a first one of the semiconductor structures (e.g., 100) needs at least one device layer and a second one of the device layers (e.g., 1100) needs at least two device layers to create via last to via first conversion.

The conversion of via last to via first based hybrid 3DIC structures offers many advantages over the more conventional via first or via last 3DIC structures, for example, including, but not limited to, a reduction in total processing steps for same number of device layers (e.g., 124), maximum possible metal layer counts, placement of heterogeneous elements in each of the device layers, opportunity for multiple active circuits in semiconductor structures and devices, ability to connect multiple multilayer functional sections at a thinnest possible cross section, and ability to connect between any two arbitrary layers with smallest interconnect within the hybrid 3DIC.

Bonding of multiple device layers in a single semiconductor device (e.g., 2100), for example, allows for the mixing of III-V transistors with Silicon CMOS (e.g., Si+GaN for RF circuits, Si+III-V FETs for high performance digital circuits, Si+III-V TFETs for low power digital circuits, InGaAs for Image Sensors or detectors with Si Readout Circuits). Additional advantages of the concepts, systems, circuits and techniques sought to be protected herein include providing for a thinnest possible active area cross section, highest possible 3D density, ability to integrate old, current and new technology nodes together (e.g., 150 nm, 90 nm, 65 nm, 32 nm, 22 nm, 7 nm and nodes can be accommodated in a multi-functional combination), and ability to integrate multiple foundry process together.

Additional aspects of the concepts, systems, circuits and techniques sought to be protected herein, with particular emphasis on semiconductor interconnect structures (e.g., via joining layers) are described in conjunction with the figures below.

Figure 2:
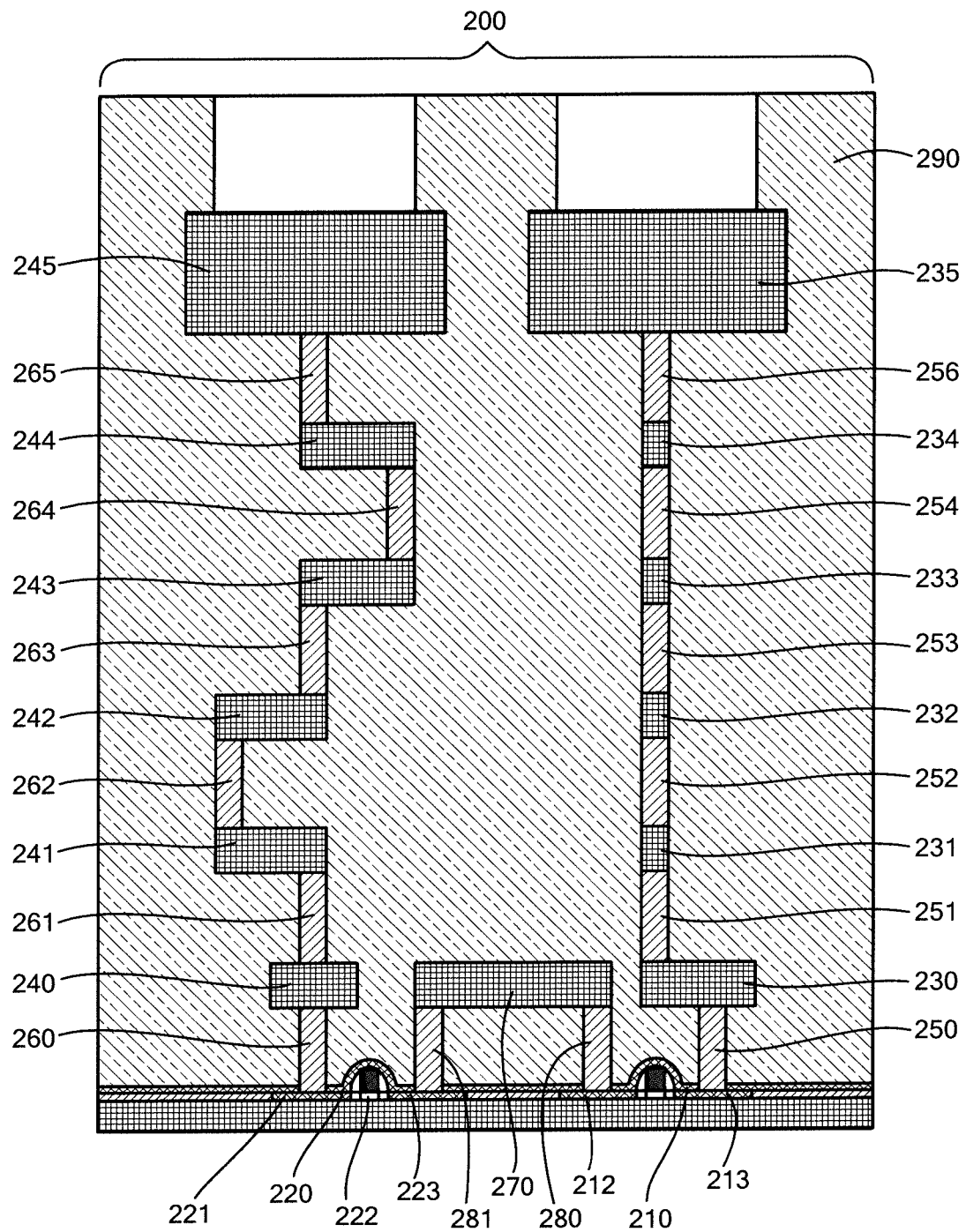
FIG. 2 is a block diagram of an example layer of an example semiconductor structure.

Referring now to FIG. 2 an example layer (e.g., a "device layer") 200 of an example semiconductor structure (e.g., semiconductor structure 100, shown in FIG. 1) includes a plurality of circuit components, a plurality of conductive planes (e.g., conductive planes of the same potential) and a plurality of electrical connections (e.g., vias) for electrically coupling the circuit components to one or more of the plurality of conductive planes (e.g., a ground plane or a voltage plane). In the example embodiment shown, the plurality of circuit components are provided as first and second three terminal devices (e.g., a field-effect transistors (FETs)) 210, 220. Additionally, the plurality of electrical connections are provided from one or more electrical connections or vias (e.g., through hole vias, blind vias, buried vias, open vias, stacked vias, and step (or staggered) vias).

A first one of the three terminal devices (also sometimes referred to as a "first three terminal device") 210 has a first terminal (e.g., a source terminal) 211 electrically coupled to conductive plane 270 via electrical connection 280, a second terminal (e.g., a gate terminal) 212 and a third terminal (e.g., a drain terminal) 213 electrically coupled to first ones of the plurality of conductive planes (230, 231, 232, 233, 234, 235) via first ones of the plurality of electrical connections (250, 251, 252, 253, 254, 255). A second one of the three terminal devices (also sometimes referred to as a "second three terminal device") 220 has a first terminal (e.g., a source terminal) 221 electrically coupled to second ones of the plurality of conductive planes (240, 241, 242, 243, 244, 245) via second ones of the plurality of electrical connections (260, 261, 262, 263, 264, 265), a second terminal (e.g., a gate terminal) 222, and a third terminal (e.g., a drain terminal) 223 electrically coupled to conductive plane 270 via electrical connection 281. The first and third terminals of each of three terminal devices 210, 220 provide current conducting terminals of the three terminal devices. In one embodiment, layers such as layer 200 are produced by fabricating individual semiconductor functional sections of fully depleted SOI (FDSOI) circuits, with a 150-nm to 20-nm FET gate length, 40-nm or less thick SOI active layer, and multiple metal interconnect layers. The FDSOI circuits may, for example, be designed using conventional logic design rules.

Figure 3:
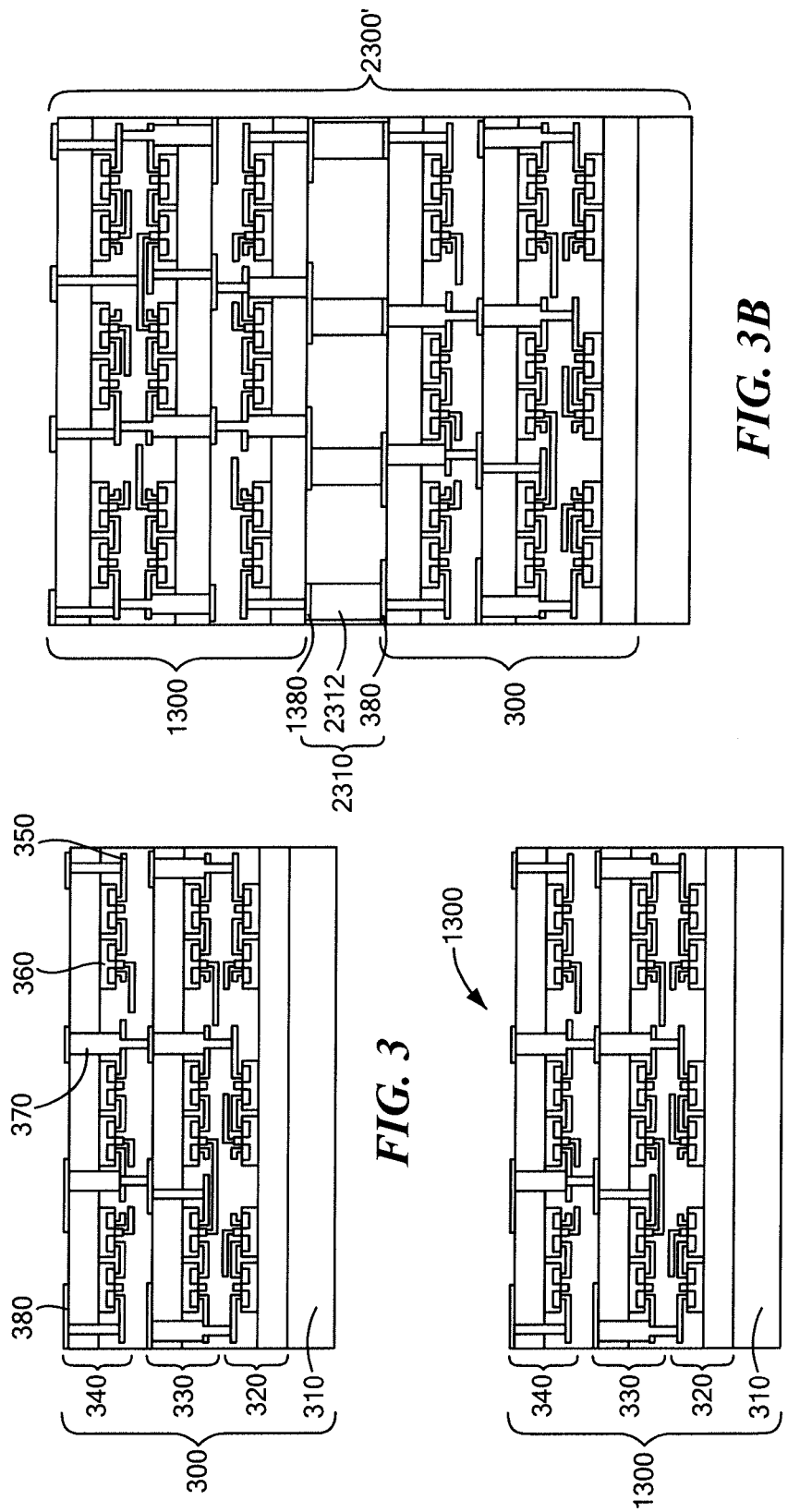

Referring now to FIG. 3, an example semiconductor structure (e.g., a wafer or die) 300 as may be fabricated through via-last and/or via-first techniques, for example, includes a plurality of sections (e.g., functional sections which include one or more device layers such as device layer 124, FIG. 1), here three sections. A first one of the sections (e.g., a tier-1 functional section) 320, which is also sometimes referred to herein as a "first section" 320, has first and second opposing surfaces and a plurality of electrical connections (e.g., vias) extending between select portions of the first and second surfaces. The electrical connections may, for example, be made by drilling holes through the first section 320 in appropriate locations and plating the inside of the holes with a conducting material (e.g., copper). The first section 320 may be fabricated using either Silicon-On-Insulator (SOI) or bulk complementary metal-oxide semiconductor (CMOS) fabrication techniques, for example.

A second one of the sections (e.g., a tier-2 functional section) 330, which is also sometimes referred to herein as a "second section" 330, has first and second opposing surfaces. The second section 330, which may be fabricated using SOI fabrication techniques, for example, includes a device layer having first and second opposing surfaces and a plurality of electrical connections extending between the first and second surfaces. The second surface of the device layer corresponds to the second surface of the second section 330. The second section 330 also includes an insulating layer which is provided from an electrically-insulating material (e.g., etch-stoppable oxide material such as Silicon Oxide (SiO$_x$)), the insulating layer having first and second surfaces. The first surface of the insulating layer, which corresponds to the first surface of the second section 330, is disposed over and coupled to the second surface of the first section 320.

A third one of the sections (i.e., a tier-3 functional section) 340, which is also sometimes referred to herein as a "third section" 340 and is similar to second section 330 in the example embodiment shown, has first and second opposing surfaces. The first surface of the third section 340 is disposed over and coupled to the second surface of the second section 330. The third section 340 includes a device layer having first and second opposing surfaces and a plurality of electrical connections extending between the first and second surfaces. The second surface of the device layer corresponds to the second surface of the third section 340. The third section 340 also includes an insulating layer having first and second opposing surfaces. The first surface of the insulating layer corresponds to the first surface of the third section 340.

The semiconductor structure 300 also includes one or more conductive structures (e.g., 370) extending between select ones of the plurality of electrical connections in the first section 320, select ones of the plurality of electrical connections in the device layer of the second section 330, and/or select ones of the plurality of electrical connections in the device layer of the third section 340. Example conductive materials for the conductive structures include, but are not limited to: titanium, titanium-nitride, tungsten and/or other suitable electrically conductive materials.

The semiconductor structure 300 additionally includes a plurality of interconnect pads (e.g., 380). The interconnect pads, which each have first and second opposing surfaces and a plurality of sides, are provided in a pattern or shape which promotes scalability of the semiconductor structure 300 (e.g., for coupling semiconductor structure 300 to other semiconductor structures or devices). A first surface of the interconnect pads is disposed over or beneath (e.g., attached or otherwise coupled to) select portions of at least the second surface of semiconductor structure 300 using techniques well known to those of ordinary skill in the art. Select ones of the interconnect pads (e.g., 380) are also electrically coupled to the conductive structures (e.g., 370) in semiconductor structure 300. The electrical coupling may, for example, occur through bond wires or via contacts spaced between the first surface of the interconnect pads and the conductive structures in a region below the interconnect pads. At least one of the one or more conductive structures (e.g., micro vias and/or sub-micron vias) in semiconductor structure 300 extends between select ones of the plurality of electrical connections in the device layer of the second section, select ones of the plurality of electrical connections in the device layer of the third section, and the first surface of select ones of the interconnect pads.

The interconnect pads, which may have a substantially circular, rectangular or square shape, for example, may be formed of a single layer of material, or multiple layers of material. Those of ordinary skill in the art will understand how to select the shape and size of the interconnect pads for a particular application (e.g., based on pitch and assembly risk sites). Example electrically conductive materials for the interconnect pads include, but are not limited to: copper, aluminum, gold/nickel/Cu, gold/platinum/Titanium/Al and/or other suitable electrically conductive materials.

The semiconductor structure 300 further includes an optional support or "handle" structure (e.g., a handle substrate) 310 having first and second opposing surfaces. The handle structure, which may be provided from Silicon (Si), Silicon carbide (SiC) and/or Sapphire as a few examples, may be used for coupling semiconductor structure 300 to machinery for aligning and coupling semiconductor structure 300 to other semiconductor structures (e.g., semiconductor structure 1300, as will be discussed), for example. In the example embodiment shown, the second surface of the handle structure 310 is disposed over and coupled to the first surface of semiconductor structure 300. The handle structure 310 may be provided as part of or separate from semiconductor structure 300.

In some embodiments, at least one of the one or more conductive structures extends between select ones of the plurality of electrical connections in the first section 320 and select ones of the plurality of electrical connections in the device layer of the second section 330 is provided as a through insulator via (TIV) conductive structure.

Additionally, in some embodiments, the insulating layer of at least the second section 330 is provided from an oxide material including at least one of silicon dioxide (SiO$_2$) and chemically treated silicon oxide (SiO). The SiO may be chemically treated through a physical (e.g. plasma) and or chemical (e.g., solution) process (e.g., to convert the SiO from a conventional oxide to a self-bondable oxide). Further, in some embodiments, at least one of the one or more conductive structures extending between select ones of the plurality of electrical connections in the device layer of the second section is provided as a through oxide via (TOV) conductive structure.

Referring now to FIG. 3A, an example semiconductor structure 1300 similar to semiconductor structure 300 of FIG. 3 is shown. Semiconductor structure 1300 includes a first section 320, a second section 330, a third section 340 and, optionally, a handle structure 310.

Referring now to FIG. 3B, an example multi-layer semiconductor device 2300' as may be provided in an example method for fabricating a semiconductor device including at least two semiconductor structures in accordance with the concepts, systems, circuits and techniques sought to be protected herein is shown.

The multi-layer semiconductor device 2300' includes semiconductor structure 300 and semiconductor structure 1300 of FIGS. 3 and 3A, respectively. The multi-layer semiconductor device 2300' also includes a via joining layer 2310 disposed between and coupled to second surfaces of each of the semiconductor structure 300 and the semiconductor structure 1300. The via joining layer 2310 has first and second opposing surfaces and at least one conductive structure (e.g., conductive structure 2312) extending between select portions of the first and second surfaces. The at least one conductive structure, which is provided from one or more electrically conductive materials (e.g., copper, gold or aluminum) which may be the same as or similar to the material from which the interconnect pads of semiconductor structure 300 and semiconductor structure 1300 are provided, is electrically coupled to second surfaces of select ones of the one or more interconnect pads (e.g., interconnect pad 380) on semiconductor structure 300 and semiconductor structure 1300 to form one or more electrical connections between semiconductor structure 300 and semiconductor structure 1300.

It should, of course, be appreciated that the embodiment shown in FIG. 3B is representative of one example configuration of multi-layer semiconductor device 2300' and one example approach for creating multi-layer semiconductor device 2300'. Several other example approaches for producing multi-layer semiconductor device 2300' (and similar, electrically equivalent semiconductor devices) are, for example, described below.

Approach 1: An electrically equivalent multi-layer semiconductor device 2300' includes: via last between first section 320 and second section 330 of semiconductor structure 300, and via last between second section 330 and third section 340 of semiconductor structure 300, via last between first section 320 and second section 330 of semiconductor structure 1300, via last between second section 330 and third section 340 of semiconductor structure 1300, and via first between third section 340 of semiconductor structure 300 and third section 340 of semiconductor structure 1300. Thus, in approach 1, the electrically equivalent semiconductor device 2300' has a via last-via last-via first-via last-via last combination. Specifically, converting via last of third section 340 in semiconductor structure 300 and semiconductor structure 1300 to via first (e.g., through via joining layer 2310) creates an electrical interconnection among semiconductor structure 300 and semiconductor structure 1300 to create electrically equivalent semiconductor device 2300'.

Approach 2: An electrically equivalent multi-layer semiconductor device 2300' includes: via first between first section 320 and second section 330 of semiconductor structure 300, via last between third section 330 and fourth section 340 of semiconductor structure 300, via first between first section 320 and second section 330 of semiconductor structure 1300, via last between third section 330 and fourth section 340 of semiconductor structure 1300, and via first between fourth section 340 of semiconductor structure 300 and fourth section 340 of semiconductor structure 1300. Thus, the electrically equivalent semiconductor device 2300' has via first-via last-via first-via last-via first combination. Specifically, replacing via last with via first between first section 320 and second section 330, and converting via last of fourth section 340 in semiconductor structure 300 and semiconductor structure 1300 to via first (e.g., through via joining layer 2310) creates an electrical interconnection among the semiconductor structure 300 and semiconductor structure 1300 to create electrically equivalent semiconductor device 2300'.

Approach 3: An electrically equivalent multi-layer semiconductor device 2300' includes: via first between second section 320 and third section 330 of semiconductor structure 300, via first between third section 330 and fourth section 340 of semiconductor structure 300, via first between second section 320 and third section 330 of semiconductor structure 1300, via first between third section 330 and fourth section 340 of semiconductor structure 1300, and via first between fourth section 340 of semiconductor structure 300 and fourth section 340 of semiconductor structure 1300. Thus, electrically equivalent semiconductor device 2300' has a via first-via first-via first-via first-via first combination.

Specifically, making via first separately between second section 320 and third section 330 of semiconductor structures 300 and 1300, via first between fourth section 340 of semiconductor structure 300 and fourth section 340 of semiconductor structure 1300, and creating via first between third section 330 and fourth section 340 of semiconductor structures 300, 1300 will reduce significant processing steps to create electrically equivalent semiconductor device 2300'. This approach will create shortest interconnect between device layers and create interconnect between interconnect layers without adding stubs. This approach also used minimum active area of semiconductor structures 300, 1300 and, thus, enables the use of maximum space for active devices in semiconductor structures 300, 1300. Here, via first between third section 330 and fourth section 340 requires larger pitch than via first between second section 320 and third section 330 to reduce (or eliminate) misalignment, for example.

Fourth approach: An electrically equivalent multi-layer semiconductor device 2300' includes: via last between second section 320 and third section 330 of semiconductor structure 300, via last between third section 330 and fourth section 340 of semiconductor structure 300, via last between second section 320 and third section 330 of semiconductor structure 1300, via last between third section 330 and fourth section 340 of semiconductor structure 1300, and via last between fourth section 340 of semiconductor structure 300 and fourth section 340 of semiconductor structure 1300. Thus, electrically equivalent semiconductor device 2300' has a via last-via last-via last-via last-via last combination. This approach is a sequential process and requires maximum processing steps to create electrically equivalent semiconductor device 2300'. This option also uses isolated device space to create interconnects between device layers. Via last is used to minimize misalignment and create finer pitch interconnects among one or more of the layers in semiconductor device 2300'.

Figure 4:
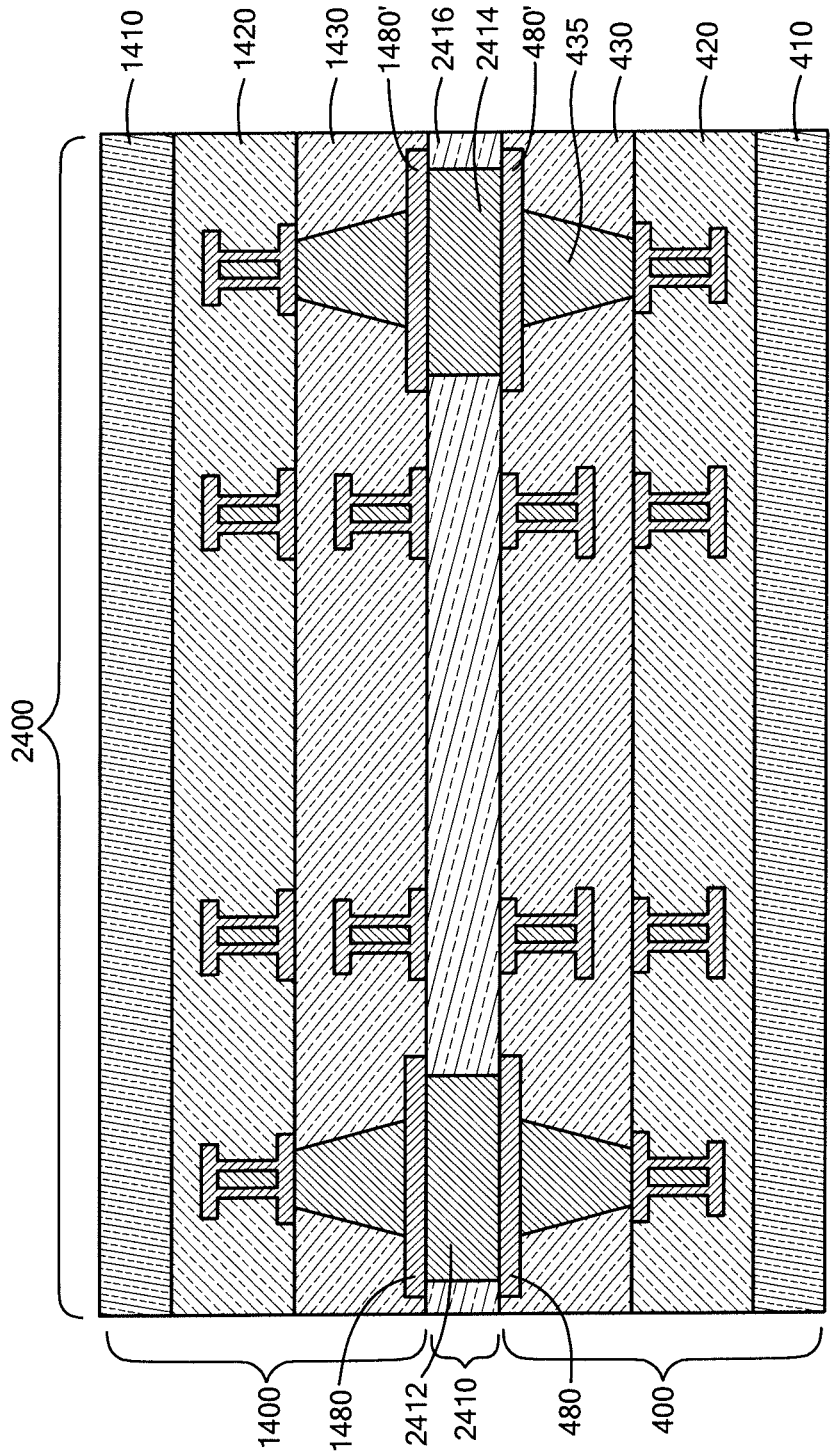
FIG. 4 is a block diagram of another example multi-layer semiconductor device.

Approaches 1 and 2 discussed above may be further optimized to minimize processing steps to achieve finer pitch 3DICs. FIG. 4 is an example of via last-via first-via last approach where via last is converted to via first to produce unique via structure in a 3DIC (or multi-layer semiconductor device), for example.

Referring now to FIG. 4, another example multi-layer semiconductor device 2400 includes a first semiconductor structure 400, a second semiconductor structure 1400 and a via joining layer 2410. Each of the first and second semiconductor structures 400, 1400 has first and second opposing surfaces and includes a first section (e.g., 420, 1420) having first and second opposing surfaces, with the first surface of the first section corresponding to the first surface of the first and second semiconductor structures. Each of the first and second semiconductor structures 400, 1400 also includes a second section (e.g., 430, 1430) having first and second opposing surfaces, with the first surface of the second section disposed over and coupled to the second surface of the first section. In the example embodiment shown, the first surface of each first section corresponds to the first surface of the semiconductor structures and the second surface of each second section corresponds to the second surface of the semiconductor structures.

Each of the first and second semiconductor structures 400, 1400 also includes a handle structure (e.g., 410, 1410) having first and second opposing surfaces, with the first surface of each handle structure disposed over first surfaces of the first and second semiconductor structures. The handle structures are optional in some embodiments.

Via joining layer 2410 is disposed between and coupled to second surfaces of each of the first and second semiconductor structures 400, 1400. The via joining layer 2410 has first and second opposing surfaces and includes a plurality of conductive structures (here, first and second conductive structures 2412, 2414) extending between select portions of the first and second surfaces. The plurality of conductive structures may include a plurality of conducting metals, the plurality of conducting metals including at least one of Nickel (Ni), Copper (Cu), Aluminum (Al), Zinc (Zn) and Tin (Sn). The via joining layer 2410 also includes an oxide material (or layer) 2416 disposed between select portions of the first and second surfaces of the via joining layer 2410.

A first one of the conductive structures (also sometimes referred to as a "first conductive structure") 2412 has a first end electrically coupled to a second surface of interconnect pad 480 on first semiconductor structure 400 and a second, opposing end electrically coupled to a second surface of interconnect pad 1480 on second semiconductor structure 1400. Second surfaces of the interconnect pads (e.g., 480, 1480) may include a combination of Titanium (Ti), Titanium Nitride (TiN), Aluminum (Al) and Copper (Cu) (e.g., with Cu comprising less than one percent of the combination), a combination of Ti and Al, or a combination of Ti, Al and Cu (e.g., with Cu comprising less than one percent of the combination), for example. Additionally, a second one of the conductive structures (also sometimes referred to as a "second conductive structure") 2414 has a first end electrically coupled to a second surface of interconnect pad 480' on first semiconductor structure 400 and a second, opposing end electrically coupled to a second surface of interconnect pad 1480' on second semiconductor structure 1400. In doing so, via joining layer 2410 electrically couples first semiconductor structure 400 to second semiconductor structure 1400 to form a multi-layer semiconductor device (i.e., multi-layer semiconductor device 2400) including at least two semiconductor structures (i.e., first semiconductor structure 400 and second semiconductor structure 1400).

In the example embodiment shown, a first one of the electrical connections (or vias) formed between the first and second semiconductor structures 400, 1400 (e.g., through first conductive structure 2412) is an electrical connection between first select ones of the plurality of electrical connections (e.g., micro vias and/or sub-micron vias and/or nano vias) in the first section 420 of the first semiconductor structure 400 and first select ones of the plurality of electrical connections (e.g., micro vias and/or sub-micron vias) in the first section 1420 of the second semiconductor structure 1400. Additionally, in the example embodiment shown, a second one of the electrical connections formed between the first and second semiconductor structures 400, 1400 (e.g., through second conductive structure 2414) is an electrical connection between second select ones of the plurality of electrical connections (e.g., micro vias and/or sub-micron vias and/or nano vias) in the first section 420 of the first semiconductor structure 400 and second select ones of the plurality of electrical connections (e.g., micro vias and/or sub-micron vias and/or nano vias) in the first section 1420 of the second semiconductor structure 1400.

Conductive structures (e.g., micro vias, sub-micron and nano vias) are patterned and etched through the buried oxide and deposited oxides of multi-layer semiconductor device 2400 to expose metal contacts in the multi-layer semiconductor device 2400. The conductive structures (e.g., 435) may, for example, be defined by a resist opening which is closely matching with a metal opening within and/or at an end of each device section, and etched through existing dielectric regions in the field such that aligning the conductive structures with a deposited dielectric is not required to achieve insulation between the vertical connections. In one embodiment, a multi-step etching process is required to create openings for conductive structures. Such process may use dry and/or wet oxide etching, metal etching and/or oxide etching. Multistep wet etching can, for example, create lateral etching to the oxides which provides for the conductive structures having a particular shape.

A titanium material having a thickness of about 10 nm and a MOCVD TiN material having a thickness of about 5 nm can be used for a liner and tungsten plugs for conductive structures. MOCVD or CVD TiN$_X$ fill with X≤1 is preferred in one embodiment for better conformal coating. Metal fill conductive structures may use chemical mechanical polishing for planarization. Additionally, a metal contact (or interconnect pad) in an upper device section of multi-layer semiconductor device 2400 may be an annulus with a 1.5-μm opening that also functions as a self-aligned hard mask during a plasma etch of an oxide material or layer beneath it to reach a corresponding metal contact in a lower device section of multi-layer semiconductor device 2400. In order to fully align the conductive structure, the size of the metal contact, and thus the pitch of the vertical interconnect, may be proportional to twice the wafer-wafer misalignment of semiconductor structures 400 and 1400, for example.

A multi metal layer pad may, for example, be further deposited on top of metal fill vias (e.g., conductive structures). In one embodiment, the metal pad includes a combination of a first Ti layer having a thickness of about 10 nm, Al or Cu layer having a thickness of about 170 nm, a second Ti layer having a thickness of about 10 nm, and TiN$_X$ (X≤5.1) (e.g., PVD TiN$_X$ (X≤1)) layer having a thickness of about 25 nm. For example, a 75 nm PVD or IMP PVD TiN may result in higher conductivity and improved critical temperature T$_C$ than MOCVD TiN. MOCVD may also require multiple passes to achieve a desired thickness.

It should, of course, be appreciated that the electrical connections formed between the first and second semiconductor structures 400, 1400 may be electrical connections between any number of the plurality electrical connections in the sections (i.e., the first and second sections) of the first semiconductor structure 400 and any number of the plurality electrical connections in the sections (i.e., the first and second sections) of the second semiconductor structure 1400.

The first section 420 of the first semiconductor structure 400 may correspond to a first section (or first tier) of the multi-layer semiconductor device 2400, the second section 430 of the first semiconductor structure 400 may correspond to a second section (or second tier) of the multi-layer semiconductor device 2400, the second section 1430 of the second semiconductor structure 1400 may correspond to a third section (or third tier) of the multi-layer semiconductor device 2400, and the first section 1420 of the second semiconductor structure 1400 may correspond to a fourth section (or fourth tier) of the multi-layer semiconductor device 2400.

In the example embodiment shown, the second section 430 of the first semiconductor structure 400 includes a first conductive structure 435 having first and second opposing surfaces extending between the first and second surfaces of the second section 430 of the first semiconductor structure 400. In one embodiment, the first and second surfaces of the first conductive structure 435 have same or similar dimensions. In another embodiment, the first surface of the first conductive structure 435 has first dimensions and the second surface of the first conductive structure 435 has second, different dimensions (e.g., as may be suitable for the electrical connection or via to which the first conductive structure 435 is to be electrically coupled to, such as a micro via, sub-micron via and/or nano via). As one example, the first surface of the first conductive structure 435 may have a diameter between about two μm and about six μm. As another example, the second surface of the first conductive structure 435 may have a diameter between about one μm and about 0.1 μm.

In some embodiments, a predetermined distance of between about one micrometer (μm) and about four μm may exist between the first and second surfaces of via joining layer 2410. The predetermined distance may, for example, correspond to a height of the via joining layer and a height of the at least one conductive structure. Additionally, in some embodiments, a predetermined distance of between about six μm and about ten μm may exist between the first and second surfaces of the second section in at least the first semiconductor structure. The predetermined distance may, for example, correspond to a height of the second section.

Further, in some embodiments, via joining layer 2410 may be formed on the second surface of the first semiconductor structure 400. Additionally, in some embodiments, via joining layer 2410 may be formed on the second surface of the second semiconductor structure 1400. Further, in some embodiments, via joining layers (i.e., first and second via joining layers) may be formed on second surfaces of each of the first and second semiconductor structures 400, 1400, as will be described further in conjunction with FIG. 6D.

Figure 4A:
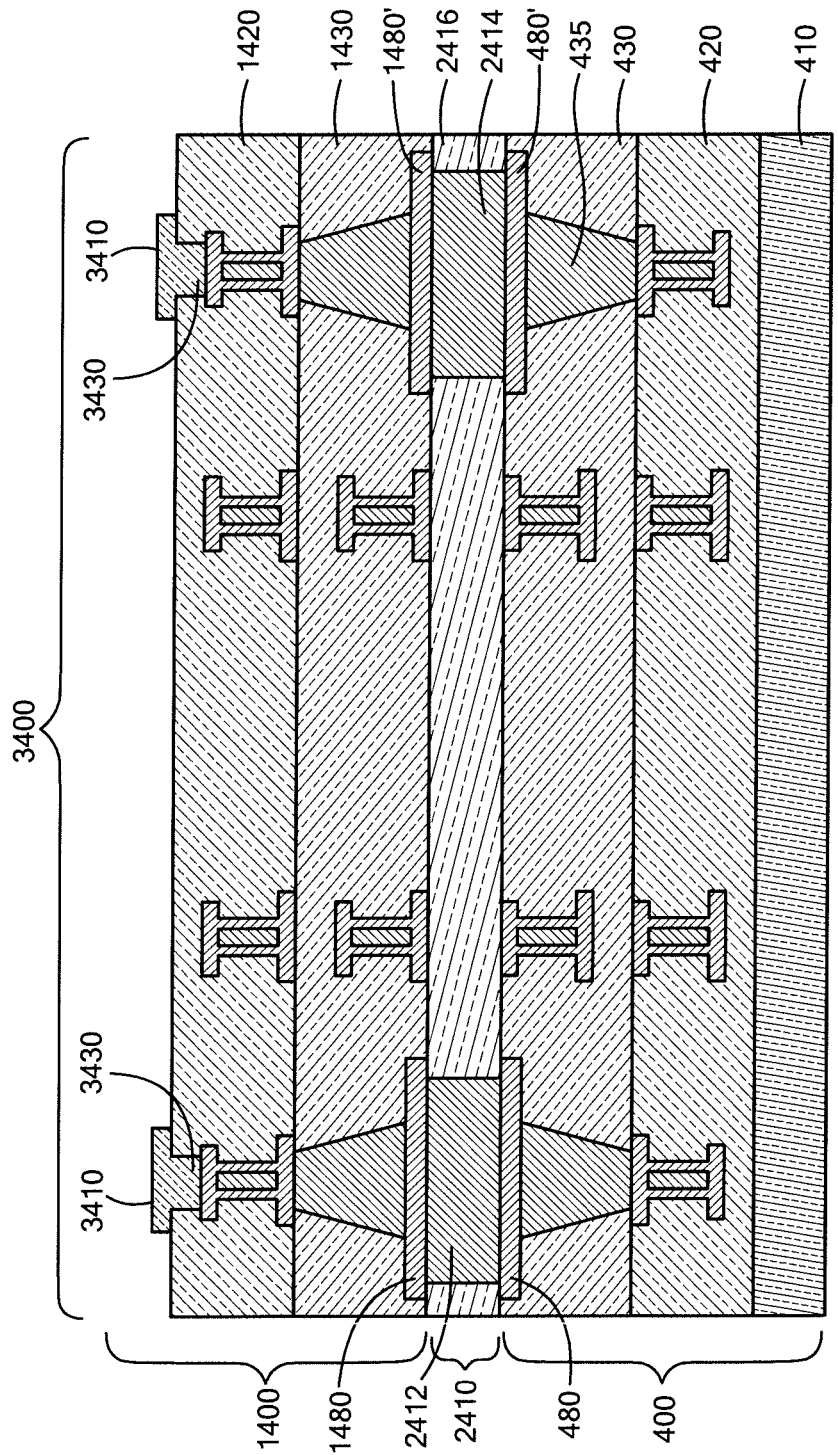
FIG. 4A is a block diagram of another example multi-layer semiconductor device.

Referring now to FIG. 4A, an example multi-layer semiconductor device 3400 similar to multi-layer semiconductor device 2400 of FIG. 4 is shown. The multi-layer semiconductor device 3400, which has first and second opposing surfaces, includes a first semiconductor structure 400, a second conductive structure 1400 and a via joining layer 2410. The first surface of semiconductor structure 400 corresponds to the first surface of multi-layer semiconductor device 3400 and the first surface of semiconductor structure 1400 corresponds to the second surface of multi-layer semiconductor device 3400.

The multi-layer semiconductor device 3400 also includes a plurality of interconnect pads (here, interconnect pads 3410, 3420) and a plurality of conductive structures (here, conductive structures 3430, 3440) for electrically coupling the interconnect pads to the electrical connections formed between the first and second semiconductor structures 400, 1400 (e.g., through first and second conductive structures 2412, 2414). The interconnect pads 3410, 3420 have first and second opposing surfaces with first surfaces of the interconnect pads 3410, 3420, which may include a combination Ti, TiN, Al and Cu (e.g., with Cu comprising less than one percent of the combination), a combination of Ti and Al, or a combination of Ti, Al and Cu (e.g., with Cu comprising less than one percent of the combination), or Al, for example, disposed over or beneath select portions of the second surface of the multi-layer semiconductor device 3400 and electrically coupled to the conductive structures 3430, 3440. In one embodiment, conductive structures 3430, 3440 include a Ti/TiN liner and Tungsten (W) fill. Such may require a single or multistep physical deposition. Additionally, in one embodiment, chemical mechanical polishing (CMP) and/or annealing can be used after each deposition.

Figure 5:
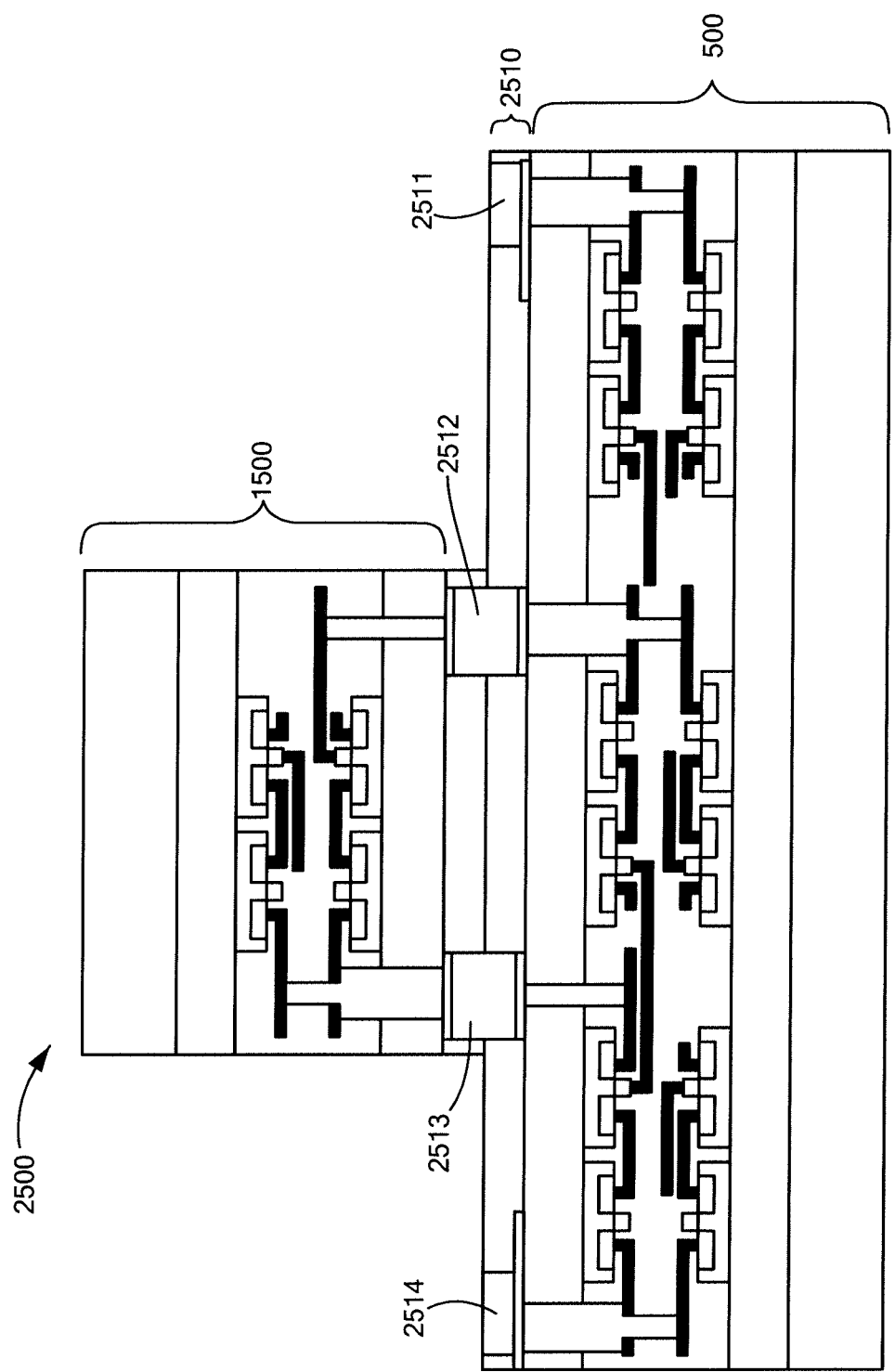
FIG. 5 is a block diagram of another example multi-layer semiconductor device.

Referring now to FIG. 5, another example multi-layer semiconductor device 2500 includes a first semiconductor structure 500, a second semiconductor structure 1500 and a via joining layer 2510. As illustrated, the first semiconductor structure 500 is provided having a first form factor and the second semiconductor structure 1500 is provided having a second, different form factor. Additionally, the via joining layer 2510, which may be provided as first and second via joining layers in some embodiments (e.g., with the via joining layer 2510 having angstrom level or nano level smooth self-bondable oxide at the bonding surface), is provided having a first plurality of conductive structures 2512, 2513 disposed between and electrically coupled the first semiconductor structure 500 and the second semiconductor structure 1500 and a second plurality of conductive structures 2511, 2514. The second plurality of conductor structures 2511, 2514 may be used for coupling the first semiconductor structure 500 to one or more additional semiconductor structures (not shown) and/or for coupling the multi-layer semiconductor device 2500 to one or more additional multi-layer semiconductor devices (not shown).

Figure 6:
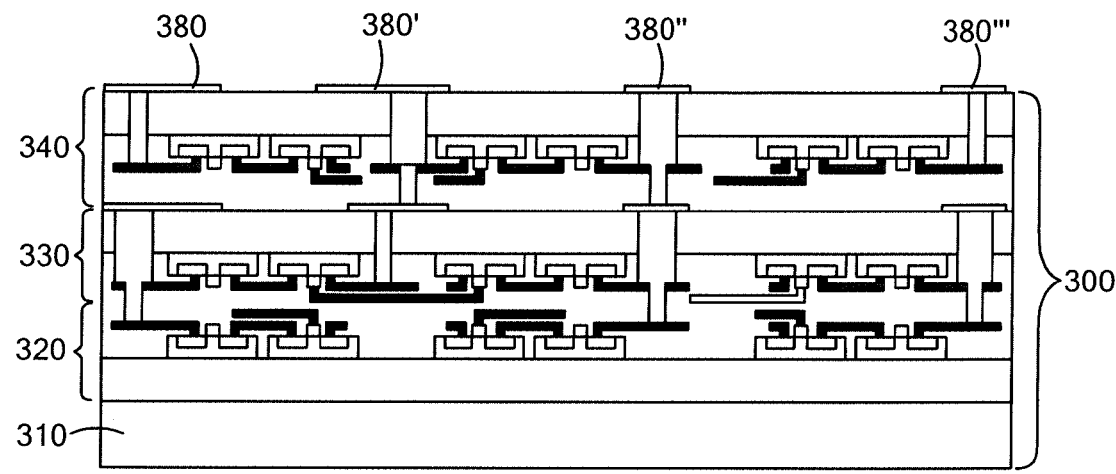
FIGS. 6-6C are block diagrams of example semiconductor structures as may be provided in an example method for fabricating a multi-layer semiconductor device in accordance with an embodiment.
Figure 6A:
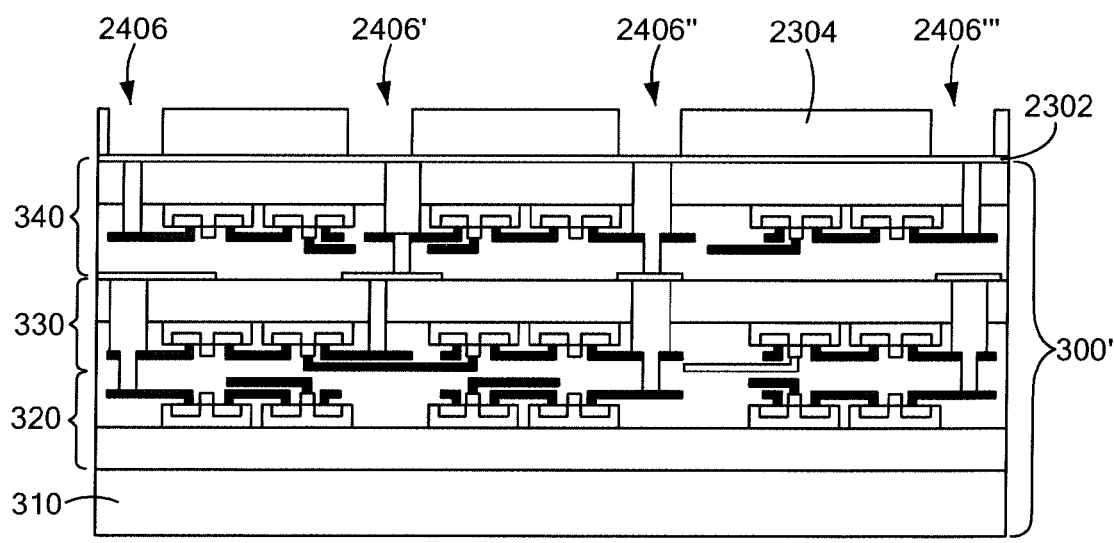
FIG. 6D is a block diagram of example semiconductor structures.
FIG. 6E is a block diagram of an example multi-layer semiconductor device including the semiconductor structures of FIG. 6D, for example.
FIG. 6F is a block diagram of an example multi-layer semiconductor device similar to the multi-layer semiconductor device of FIG. 6E, for example.
Figure 6B:
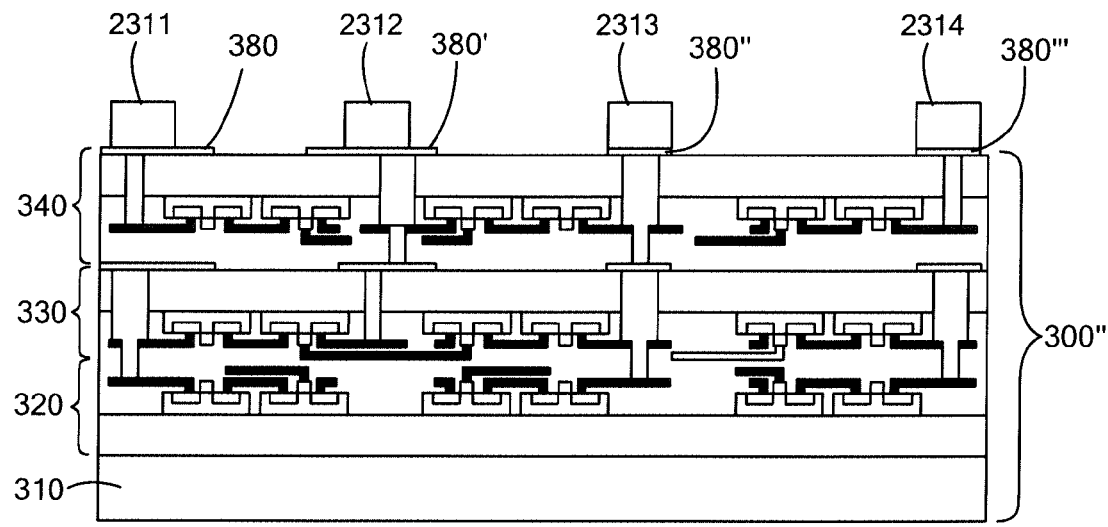
Figure 6C:
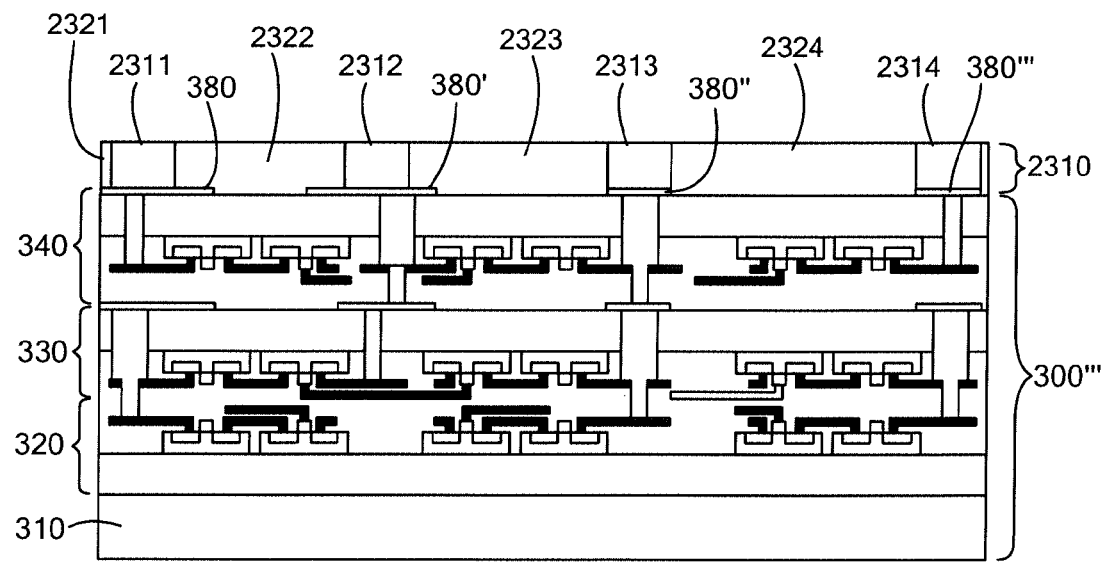

Referring now to FIGS. 6-6C, example semiconductor structures as may be provided in an example method for fabricating a multi-layer semiconductor device in accordance with the concepts, systems, circuits and techniques sought to be protected herein are shown. While FIGS. 6-6C are illustrated to comprise a sequence of processes, the example method is not limited to performing the illustrated processes in the sequence shown.

Referring now to FIG. 6, an example semiconductor structure 300 as may be provided as part of an example multi-layer semiconductor device (e.g., semiconductor device 2300, as will be discussed) including at least two semiconductor structures (e.g., semiconductor structures 300, 1300, as will be discussed) is shown. Semiconductor structure 300 is the same as the semiconductor structure shown in FIG. 3, for example, including at least a first section 320, a second section 330, a third section 340.

Semiconductor structure 300 additionally includes a plurality of conductive structures (e.g., conductive structure 370) extending between select ones of the plurality of electrical connections in the first section 320, select ones of the plurality of electrical connections in the device layer of the second section 330, and/or select ones of the plurality of electrical connections in the device layer of the third section 340.

Semiconductor structure 300 further includes a plurality of interconnect pads 380, 380', 380'', 380''' having first and second opposing surfaces and one or more sides. The first surface of each one of the interconnect pads (e.g., 380) is disposed over or beneath select portions of at least the second surface of semiconductor structure 300 (i.e., the second surface of the third section 340) and electrically coupled to select ones of the conductive structures. In the example embodiment shown, semiconductor structure 300 also includes a handle structure 310.

Referring now to FIG. 6A, an example semiconductor structure 300' includes a first section 320, a second section 330 and a third section 340. Semiconductor structure 300' also includes a plurality of conductive structures, a plurality of interconnect pads and a handle structure 310. Semiconductor structure 300' additionally includes a conductive layer 2302 having first and second opposing surfaces. The conductive layer 2302 is provided from an electrically conductive material (e.g., copper, gold or aluminum) which may be the same as or similar to the material from which the interconnect pads are provided. A first surface of the conductive layer 2302 is disposed over (e.g., attached or otherwise coupled to) at least a portion of the second surfaces of the semiconductor structure 300' and the interconnect pads in some embodiments. The conductive layer 2302 may be electrically coupled to at least the second surface of interconnect pads and patterned using photo process and/or deposited over at least a portion of the second surface of the semiconductor structure 300' and the interconnect pads by one or more physical (e.g., sputter) and chemical (e.g., electroless) processes.

In an alternative embodiment, the first surface of the conductive layer 2302, which may be provided as a patterned conductive layer, is disposed over an adhesive layer (e.g., an adhesive promoter layer) for coupling the conductive structure 2302 to the second surfaces of semiconductor structure 300' and the interconnect pads. The adhesive layer (not shown) may, for example, be provided having first and second opposing surfaces and be provided from an electrically conductive adhesive material (e.g., adhesive copper). A first surface of the adhesive layer may be disposed over at least select portions of the second surface of semiconductor structure 300'. Suitable adhesives of the adhesive layer may include die attach adhesive, adhesive tape or the like.

Semiconductor structure 300' further includes a photo resist layer 2304. The photo resist layer 2304, which may be provided from a positive photo resist material (e.g., Polymethyl methacrylate (PMMA)) or another polymer that has a property of becoming more soluble when exposed to ultraviolet light, has first and second opposing surfaces. A first surface of the photo resist layer 2304 is disposed over the second surface of the conductive layer 2302 and second surfaces of the interconnect pads. Additionally, openings having a predetermined shape are formed in select portions of the photo resist layer 2304 extending between the second surface of the photo resist layer 2304 and second surfaces of select ones of the interconnect pads. The openings may, for example, be formed by exposing the photo resist layer 2304 to an exposure energy (e.g., ultraviolet light) having a predetermined intensity distribution and, optionally, developing the photo resist layer 2304. The openings may also be formed by grinding select portions of the photo resist layer 2304.

Additionally, the openings may be formed by depositing a photo resist layer 2304 including a positive photo resist material over the second surface of the conductive layer 2302 (e.g., where the conductive layer 2302 is an unpatterned conductive layer having a thickness of less than about one micron) and second surfaces of the interconnect pads, exposing the photo resist layer 2304, and developing the photo resist layer 2304 such that the openings are formed. Additionally, one or more portions of the photo resist layer 2304 may be stripped and the photo resist layer 2304 may be etched to produce the openings.

Alternatively, the openings may be formed by depositing a photo resist layer 2304 including a negative photo resist material over the second surface of the conductive layer 2302 (e.g., where the conductive layer 2302 is a patterned conductive layer) and second surfaces of the interconnect pads, exposing the photo resist layer 2304, and developing the photo resist layer 2304. Additionally, one or more portions of the photo resist layer 2304 may be stripped and the photo resist layer 2304 may be etched to produce the openings. In one aspect, semiconductor structure 300' is representative a semiconductor structure achieved using such approach.

Referring now to FIG. 6B, an example semiconductor structure 300" includes a first section 320, a second section 330 and a third section 340. Semiconductor structure 300" also includes a plurality of conductive structures, a plurality of interconnect pads 380, 380', 380", 380'" and a handle structure 310. Semiconductor structure 300' additionally includes a plurality of via joining layer conductive structures 2311, 2312, 2313, 2314 (also sometimes referred to as "conductive structures"). Conductive structures 2311, 2312, 2313, 2314 may, for example, be formed by disposing an electrically conductive material (e.g., copper, gold, or aluminum) in the openings in the photo resist layer 2304 over second surfaces of the select ones of the interconnect pads of the semiconductor structure, as shown in FIG. 6A, and developing the conductive material to form the conductive structures 2311, 2312, 2313, 2314. Conductive structures 2311, 2312, 2313, 2314 may also be deposited and formed by one or more physical (e.g., sputter) and chemical (e.g., electroless) processes.

Conductive structures 2311, 2312, 2313, 2314 are provided having a predetermined shape (e.g., a substantially spherical, cylindrical, triangular or trapezoid shape) and are electrically coupled to the exposed (or second) surface of the interconnect pads. Additionally, in the example embodiment shown, at least a portion of conductive structures 2311, 2312, 2313, 2314 extend a predetermined distance above the second surface of the semiconductor structure. Those of ordinary skill in the art will understand how to select the predetermined distance for a particular application (e.g., for finer pitch applications). As one example, the predetermined distance, which is related to the height of conductive structures 2311, 2312, 2313, 2314, may be selected based upon a semiconductor package or assembly into which the semiconductor structure is to be integrated (e.g., flip-chip-on-board (FCOB) packaging, standard and fine pitch ball grid array (BGA) packaging, chip-scale package (CSP), system-in-package (SiP), and package-on-package (PoP) assemblies).

Interconnect pads 380, 380', 380", 380'" and conductive structures 2311, 2312, 2313, 2314 form interconnects for electrically and mechanically coupling semiconductor structure 300" to other semiconductor structures (e.g., to form a multi-layer semiconductor device, as will be discussed).

In the example embodiment shown, the photo resist layer 2304 is removed (e.g., stripped with one or more solvents which may include acetone, methanol and Isopropyl Alcohol (IPA), with acetone strip resisting methanol and IPA cleaning the surface, for example) from the second surface the conductive layer (conductive layer 2302, shown in FIG. 6A) to expose the conductive layer. Further, one or more portions of the conductive layer are removed to expose select portions of the adhesive layer (not shown) or second surface of the semiconductor structure, as illustrated in the example embodiment shown. In doing so, openings are formed between each of the conductive structures 2311, 2312, 2313, 2314.

In some embodiments, instead of forming conductive structures 2311, 2312, 2313, 2314 from the conductive material over second surfaces of interconnect pads 380, 380', 380", 380'", the conductive structures 2311, 2312, 2313, 2314 may be formed in a separate process with the conductive structures 2311, 2312, 2313, 2314 subsequently disposed over and electrically coupled to interconnect pads 380, 380', 380", 380'" through a reflow process, for example.

Referring now to FIG. 6C, an example semiconductor structure 300'" includes a first section 320, a second section 330 and a third section 340. Semiconductor structure 300'" also includes a plurality of conductive structures, a plurality of interconnect pads and a handle structure 310. Semiconductor structure 300'" additionally includes a via joining layer 2310, the via joining layer 2310 including conductive structures 2311, 2312, 2313, 2314 and a plurality of insulating structures 2321, 2322, 2323, 2324, 2325.

In one embodiment, at least one surface (e.g., a first surface) of insulating structures 2321, 2322, 2323, 2324, 2325 includes a self-bondable oxide. Conductive structures 2311, 2312, 2313, 2314 may, for example, be deposited first and insulating structures 2321, 2322, 2323, 2324, 2325 deposited second. Chemical mechanical polishing may be used to remove insulating structures 2321, 2322, 2323, 2324, 2325 from conductive structures 2311, 2312, 2313, 2314 and expose conductive structures 2311, 2312, 2313, 2314 prior to bonding. In one embodiment, at least part of conductive structures 2311, 2312, 2313, 2314 includes a high CTE metal. Additionally, in one embodiment, part of the conductive structures 2311, 2312, 2313, 2314 structures includes a multi-metal layer where at least one of the layers in the multi-metal layer includes a low melting point metal, a fusible metal, and/or a fusible alloy.

Use of a high CTE metal, a fusible metal, and/or a fusible alloy may, for example, help to create an electrical connection between semiconductor structure 300''' and semiconductor structure 1300''' during bonding. The high CTE metal, fusible metal, and/or fusible alloy may be annealed after bonding to create electrical connection between semiconductor structures 300''' and 1300'''. Additionally, in one embodiment, the metals can react with each other metal during bonding or a post bonding process to create high temperature melt conductive fusible alloy and/or solid solution.

Further, an oxide material or layer may be deposited on one or more sides (e.g., first and/or second sides) of at least one of semiconductor structure 300'' and 1300'''. For a semiconductor structure including an oxide material or layer or first and second surfaces, for example, one side can have PECVD oxide and other side can have thermal oxide. Additionally, each oxide surface may go through chemical mechanical polishing (CMP) and subsequent annealing in presence of hydrogen and/or nitrogen one or more times. Moreover, annealing can be done after completing CMP on both sides. In one embodiment, a thermal oxide is used on a first surface of the semiconductor structure (e.g., 300''') and a self-bondable oxide is used on a second surface (e.g., bonding side) of the semiconductor structure (e.g., 300'''). CMP may, for example, be required on the first surface of at least one of the semiconductor structures (e.g., 300''') for infrared camera alignment.

Further, in one embodiment, one or more conductive materials may be deposited within each of the resist and/or dielectric openings of semiconductor structure 300''' (as shown in FIG. 6C, for example) to form conductive structures 2311, 2312, 2313, 2314. Such deposition may, for example, be accomplished using a conventional evaporation process. The process may include plasma oxide etching, ion milling to remove any residual oxide or contaminates, applying an adhesion promoter (e.g., Ti, Cr), applying a barrier layer (e.g., Ni, Pt), and applying a noble metal (e.g., Au, Ag) or high conducting metal (Cu, Al), high CTE metal and or fusible metal. A conductive metal (or metal structure) including at least one fusible metal may also be used to form conductive structures 2311, 2312, 2313, 2314. Depending on the desired sintering (and, possibly, melting) temperature(s) desired to sinter (and, possibly, melt) the metals and thereby form sound conductive paths through the conductive structures 2311, 2312, 2313, 2314, the conductive structures 2311, 2312, 2313, 2314 may further include additional elements. Such elements may include high CTE metal, aluminum, platinum, copper, gold, silver etc.

In accordance with one aspect of the concepts, systems, circuits and techniques sought to be protected herein, the conductive materials, once deposited within a respective opening, are capable of undergoing an expansion and/or sintering phase and/or melting to forming robust electrical paths through the interconnects of the semiconductor structure 300''' (including the plurality of electrical connections in semiconductor structure 300'''). In addition to sintering, the conductive materials may also include elements (e.g., solder metal) which will melt to thereby form still further contiguous paths for circuit flow. Importantly, if these added elements are used, the melting is not to occur until at least sintering has begun and, possibly, after sintering has been achieved. The result of this is the formation of circuit paths formed by sintering and melting, thereby providing for highly conductive interconnects in the semiconductor structure 300''' due to the presence of the conductive materials (and, thus, conductive structures 2311, 2312, 2313, 2314) therein.

Insulating structures 2321, 2322, 2323, 2324, 2325, which each have at least first and second opposing surfaces, may, for example, be formed by disposing an electrically-insulating material (e.g., Silicon oxide ($SiO_X$)) in at least the openings between each of conductive structures 2311, 2312, 2313, 2314. The first surface of each of the insulating structures 2321, 2322, 2323, 2324, 2325 is coupled to the second surface of semiconductor structure 300''' (and, in some embodiments, select portions of the second surfaces of the interconnect pads). Additionally, the second surface of each of the insulating structures 2321, 2322, 2323, 2324, 2325 extends a predetermined distance above the second surface of semiconductor structure 300'''. Insulating structures 2321, 2322, 2323, 2324, 2325 may be provided as or form an insulating layer.

In the example embodiment shown, conductive structures 2311, 2312, 2313, 2314 and insulating structures 2321, 2322, 2323, 2324, 2325 collectively form the via joining layer 2310. First surfaces of conductive structures 2311, 2312, 2313, 2314 and insulating structures 2321, 2322, 2323, 2324, 2325 correspond to a first surface of the via joining layer 2310 and second surfaces of conductive structures 2311, 2312, 2313, 2314 and insulating structures 2321, 2322, 2323, 2324, 2325 correspond to a second, opposing surface of the via joining layer 2310.

Figure 6D:
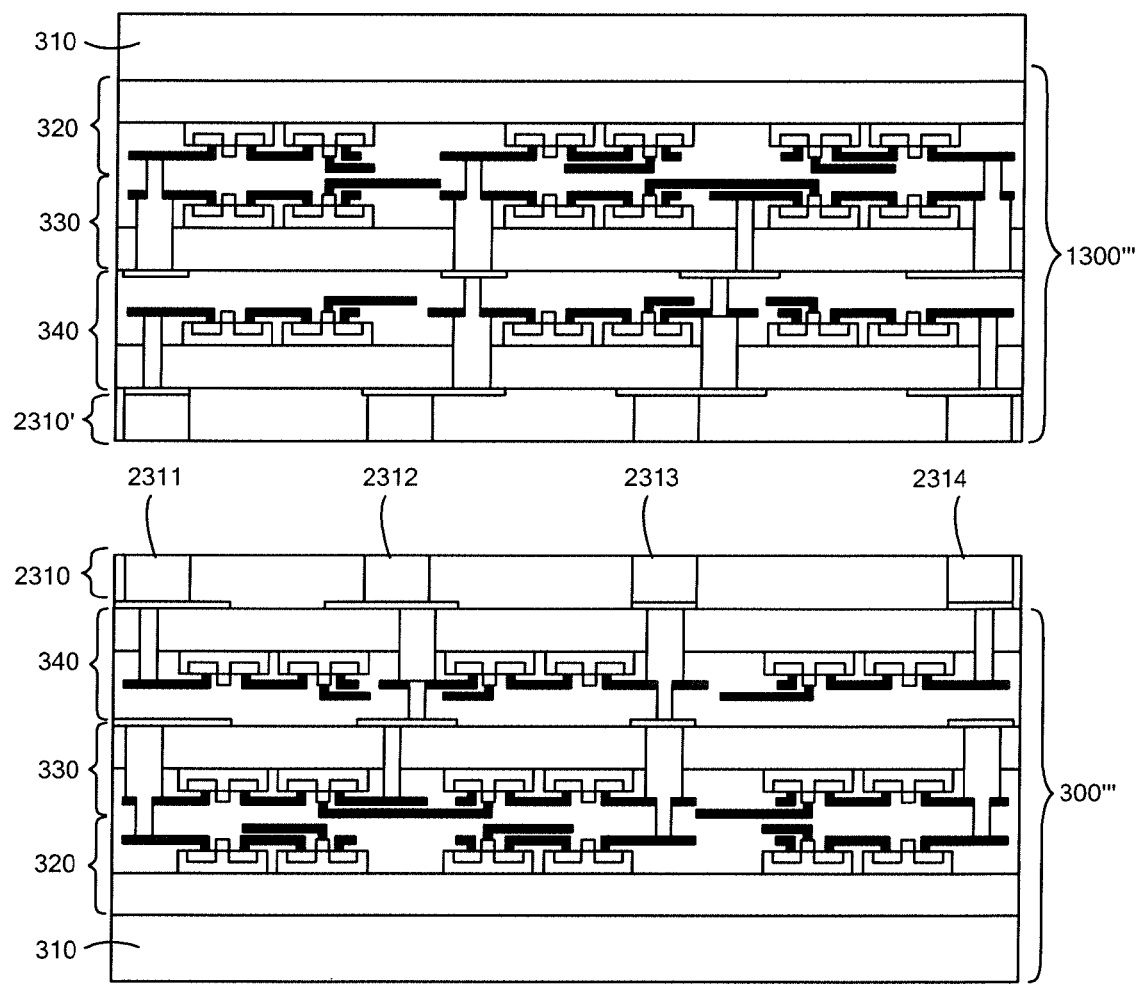

Referring now to FIG. 6D, example semiconductor structures as may be provided as part of an example multi-layer semiconductor device (e.g., semiconductor device 2300, as will be discussed) including at least two semiconductor structures (e.g., semiconductor structures 300''' and 1300''', as will be discussed) are shown. In the example embodiment shown, a first one of the semiconductor structures (i.e., a first semiconductor structure) 300''', which is the same as the semiconductor structure shown in FIG. 6C, for example, includes a first section 320, a second section 330 and a third section 340. Semiconductor structure 300'' also includes a plurality of conductive structures, a plurality of interconnect pads and a handle structure 310. Semiconductor structure 300''' additionally includes a via joining layer 2310 (also sometimes referred to as a "first via joining layer" 2310).

Additionally, a second one of the semiconductor structures (i.e., a second semiconductor structure) 1300''', which is similar to first semiconductor structure 300''' in the example embodiment shown, includes a first section 320, a second section 330 and a third section 340. Semiconductor structure 1300''' also includes a plurality of conductive structures, a plurality of interconnect pads and a handle structure 310. Semiconductor structure 300''' additionally includes a via joining layer 2310' (also sometimes referred to as a "second via joining layer" 2310'). Second surfaces of the first and second via joining layers 2310, 2310' may be smoothed or planarized (e.g., with an angstrom level and or nano level surface roughness) through a chemical mechanical planarization or polishing (CMP) process for example.

Figure 6E:
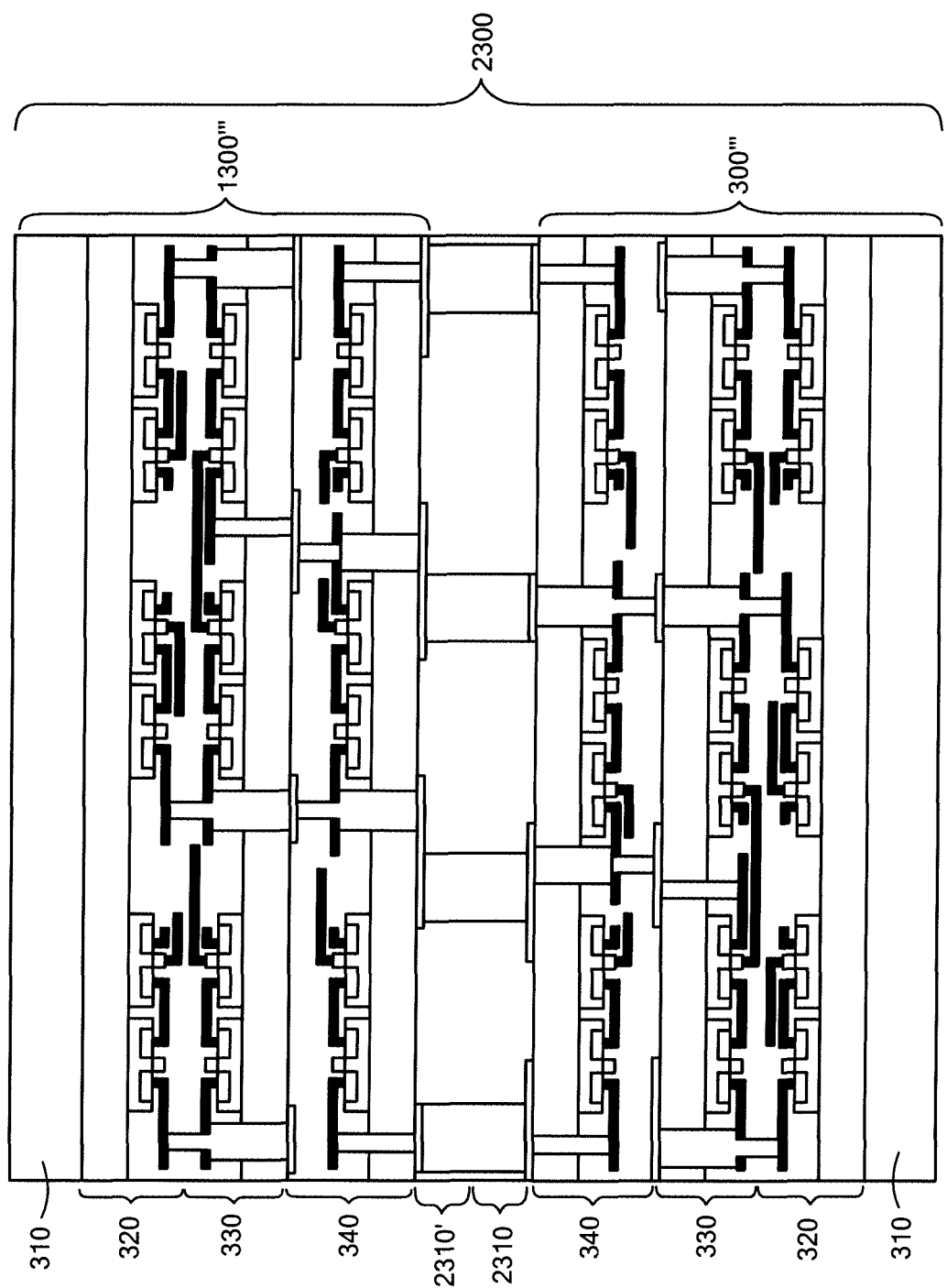

Referring now to FIG. 6E, an example semiconductor device 2300 as may be provided in an example method for fabricating a multi-layer semiconductor device including at least two semiconductor structures (e.g., semiconductor structures 300''' and 1300''') in accordance with the concepts, systems, circuits and techniques sought to be protected herein is shown. Here, an optically transparent silicon 310 having a thickness between about ten micron and about twenty micron (or less) can be prepared by polishing and/or selective etching of the silicon 310.

In the example method, the second surface of the first via joining layer 2310 is aligned with the second surface of the second via joining layer 2310' such that second surfaces of the first and second via joining layers 2310, 2310' are substantially parallel to each other and spaced apart from each other by a predetermined separation distance. Additionally, the second surface of the first via joining layer 2310 is aligned with the second surface of the second via joining layer 2310' such that the conductive structures in the first via joining layer 2310 are aligned with the conductive structures in the second via joining layer 2310'.

Additionally, in the example method, the predetermined separation distance is decreased from a first distance to a second, lower distance such second surfaces of the first and second via joining layers 2310, 2310' are substantially in contact with each other. The second distance may be about zero μm such that the second surfaces of the first and second via joining layers 2310, 2310' are physically in contact with each other prior to being coupled together.

Further, in the example method, the second surface of the first via joining layer 2310 is coupled to the second surface of the second via joining layer 2310' such that the conductive structures in the first and second via joining layers 2310, 2310' are electrically coupled to each other to form one or more electrical connections between the first and second semiconductor structures 300''', 1300''', and to form the multi-layer semiconductor device 2300. The electrical connections may, for example, be formed through a reflow process in which a conductive fusible metal (not shown) disposed between second surfaces of first and second via joining layers 2310, 2310' is subjected to controlled thermal energy, which melts one or more portions of first and second via joining layers 2310, 2310' together. The conductive fusible metal may be part of one or more of first and second via joining layers 2310, 2310'. In one embodiment, the fusible metal melts during a bonding or a post bonding annealing step and reacts with high CTE metal and/or other metals (e.g., Cu, Ag, Au) of via joining layers 2310, 2310' to create a higher melting fusible alloy and/or solid solution. Thus, it is possible to shift a melting point of the fusible metal and create more reliable interconnect through first and second via joining layers 2310, 2310'.

Figure 6F:
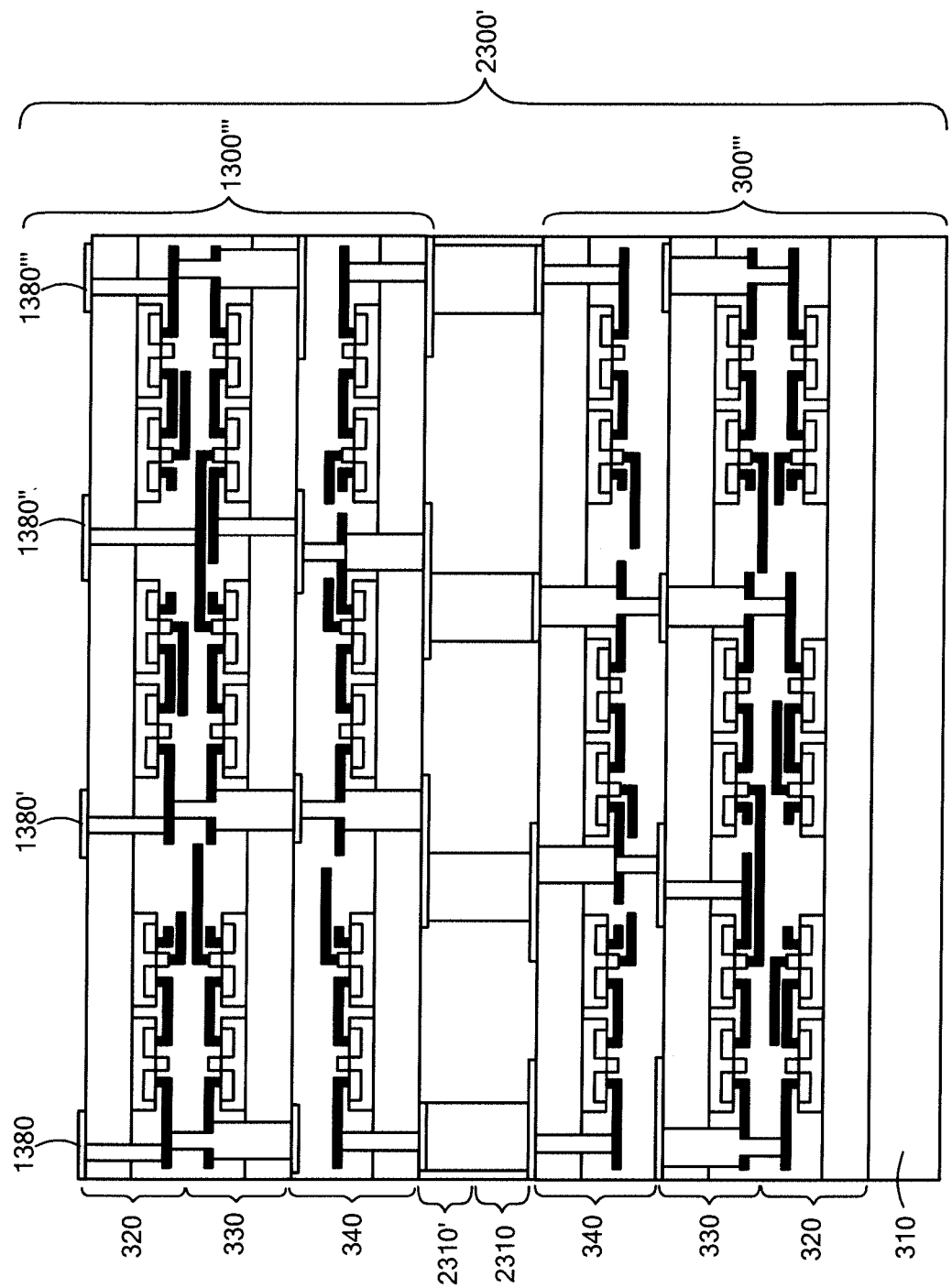

Referring now to FIG. 6F, an example multi-layer semiconductor device 2300' similar to the semiconductor structure of FIG. 6E is shown. Here, however, the handle structure on the second semiconductor structure 1300''' has been removed and the second surface of the multi-layer semiconductor device 2300' includes a plurality of interconnect pads 1380, 1380', 1380'', 1380'''. Interconnect pads 1380, 1380', 1380'', 1380''' have first and second opposing surface with a first surface of the interconnect pads 1380, 1380', 1380'', 1380''' disposed over or beneath the second surface of the multi-layer semiconductor device 2300'. The interconnect pads 1380, 1380', 1380'', 1380''' are electrically coupled to select ones of the electrical connections in the multi-layer semiconductor device 2300'. Additional semiconductor structures (i.e., third, fourth, and fifth semiconductor structures and so on) and/or additional multi-layer semiconductor devices can be added to the second surface of the multi-layer semiconductor device 2300' through further via joining layers, for example.

In some embodiments, one or more of the semiconductor structures of multi-layer semiconductor device 2300' of FIG. 6F and one or more of the semiconductor structures of FIGS. 1-6E discussed above may include or be provided as part of a multi-layer semiconductor structure, for example, such as the types described in any of U.S. Pat. Nos. 7,064,055; 7,067,909; and 7,307,003 all of which are assigned to the assignee of the present application and incorporated herein by reference in their entireties.

While the above figures illustrate various semiconductor structures and multi-layer semiconductor devices including a certain number of dies, interconnects, substrates, IC devices, components and the like, the concepts, systems, circuits and techniques disclosed herein may be applied to semiconductor structures and devices including any number of dies, interconnects, substrates, IC devices, components and the like. Conversion of Via last to via first allows for additional metal layers multiple device layers are stacked on top of each other, as shown in FIG. 6, for example. "n" number of semiconductor structures (e.g., 300, 300', shown in FIG. 3B) may be attached with each other by conversion of via last to via first approach, each semiconductor structure (300, 300') having "m" number of device layers (e.g., 320, 330, 340, shown in FIG. 3) attached with each other by oxide bonding (e.g., by via last approach).

Total additional metal layers after bonding will be =

$$n(m-1) + (n-1) = nm - n + n - 1 = nm - 1$$

Example 1

Two (n=2) semiconductor structure (300, 300'), each having 3 (m=3) device layers.
Total additional metal layers: 2×3−1=5

Example 2

Five (n=5) semiconductor structure (300, 300'), each having 3 (m=3) device layers.
Total additional metal layers: 5×3−1=14

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application (e.g., filter circuitry in mobile phones, tablets, digital cameras and the like). In contrast, the concepts, systems, circuits and techniques sought to be protected herein may be found useful in substantially any application where a semiconductor manufacturer desires to fabricate multi-layer semiconductor devices including at least two semiconductor structures.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

The invention claimed is:

1. A multi-layer semiconductor device, comprising:
   at least two semiconductor structures, each of the at least two semiconductor structures having first and second opposing surfaces and including:
      a first section having first and second opposing surfaces and a plurality of electrical connections extending between select portions of the first and second surfaces, wherein the first surface of the first section corresponds to the first surface of the at least two semiconductor structures;
      a second section having first and second opposing surfaces, wherein the first surface of the second section is disposed over and coupled to the second surface of the first section, the second section including:
         a device layer having first and second opposing surfaces and a plurality of electrical connections extending between the first and second surfaces, wherein the second surface of the device layer corresponds to the second surface of the second section; and
         an insulating layer having first and second opposing surfaces, wherein the first surface of the insulating layer corresponds to the first surface of the second section;
      one or more conductive structures extending between select ones of the plurality of electrical connections in the first section, select ones of the plurality of electrical connections in the device layer of the second section, and select portions on or beneath the second surface of each of the at least two semiconductor structures; and
      one or more interconnect pads having first and second opposing surfaces and one or more sides, wherein the first surface of each one of the interconnect pads is disposed over or beneath select portions of at least the second surface of each of the at least two semiconductor structures and select ones of the one or more interconnect pads are electrically coupled to the one or more conductive structures; the multi-layer semiconductor device further comprising:
   a via joining layer disposed between and coupled to second surfaces of each of the at least two semiconductor structures, the via joining layer having first and second opposing surfaces and at least one conductive structure extending between select portions of the first and second surfaces, wherein the at least one conductive structure is electrically coupled to second surfaces of select ones of the one or more interconnect pads on the at least two semiconductor structures to form one or more electrical connections between the at least two semiconductor structures.

2. The multi-layer semiconductor device of claim 1 wherein at least one of the one or more electrical connections formed between the at least two semiconductor structures is an electrical connection between select ones of the plurality of electrical connections in the first section of a first one of the at least two semiconductor structures and select ones of the plurality of electrical connections in the first section of a second one of the at least two semiconductor structures.

3. The multi-layer semiconductor device of claim 1 wherein a predetermined distance of between about one micrometer (μm) and about four μm exists between the first and second surfaces of the via joining layer, wherein the predetermined distance corresponds to a height of the via joining layer and a height of the at least one conductive structure.

4. The multi-layer semiconductor device of claim 1 wherein a predetermined distance of between about six micrometers (μm) and about ten μm exists between the first and second surfaces of the second section in a first one of the at least two semiconductor structures, wherein the predetermined distance corresponds to a height of the second section.

5. The multi-layer semiconductor device of claim 1 wherein the at least one conductive structure in the via joining layer includes a plurality of conducting metals, the plurality of metals including at least one of Nickel (Ni), Copper (Cu), Aluminum (Al), Zinc (Zn) and Tin (Sn).

6. The multi-layer semiconductor device of claim 1 wherein the via joining layer comprises an oxide material.

7. The multi-layer semiconductor device of claim 1 wherein the second section of a first one of the at least two semiconductor structures includes a first conductive structure of the one or more conductive structures, the first conductive structure having first and second opposing surfaces extending between the first and second surfaces of the second section of the first one of the at least two semiconductor structures, wherein the first surface of the first conductive structure has first dimensions and the second surface of the first conductive structure has second, different dimensions.

8. The multi-layer semiconductor device of claim 7 wherein the first surface of the first conductive structure has a diameter between about two μm and about three μm.

9. The multi-layer semiconductor device of claim 7 wherein the second surface of the first conductive structure has a diameter between about two μm and about three μm.

10. The multi-layer semiconductor device of claim 1 wherein at least one of the one or more conductive structures extending between select ones of the plurality of electrical connections in the first section and select ones of the plurality of electrical connections in the device layer of the second section is provided as a through insulator via (TIV) conductive structure.

11. The multi-layer semiconductor device of claim 1 wherein the insulating layer of the second section is provided from an oxide material including at least one of silicon dioxide ($SiO_2$) and chemically treated silicon oxide (SiO), wherein the SiO is chemically treated through a chemical vapor deposition process.

12. The multi-layer semiconductor device of claim 11 wherein at least one of the one or more conductive structures extending between select ones of the plurality of electrical connections in the first section and select ones of the plurality of electrical connections in the device layer of the second section is provided as a through oxide via (TOV) conductive structure.

13. The multi-layer semiconductor device of claim 1 wherein the device layer of the second section further comprises:
   one or more circuit components disposed between the first and second surfaces of the device layer, wherein the one or more circuit components are electrically coupled to select ones of the plurality of electrical connections.

14. The multi-layer semiconductor device of claim 1 wherein the device layer of the second section includes an oxide material which is deposited over the second surface of the insulating layer.

15. The multi-layer semiconductor device of claim 1 wherein at least the second section is fabricated using Silicon-On-Insulator (SOI) fabrication techniques.

16. The multi-layer semiconductor device of claim 1 wherein the first section is fabricated using either SOI or bulk complementary metal-oxide semiconductor (CMOS) fabrication techniques.

17. The multi-layer semiconductor device of claim 1 wherein the first section and the second section are substantially the same.

18. The multi-layer semiconductor device of claim 1 wherein a first one of the at least two semiconductor structures is provided having a first form factor and a second one of the at least two semiconductor structures is provided having a second different, form factor.

19. The multi-layer semiconductor device of claim 1 wherein the multi-layer semiconductor device is integrated into a communications device.

20. The multi-layer semiconductor device of claim 1 wherein at least one of the at least two semiconductor structures further includes:
  a third section having first and second opposing surfaces, wherein the first surface of the third section is disposed over and coupled to the second surface of the second section, the third section including:
    a device layer having first and second opposing surfaces and a plurality of electrical connections extending between the first and second surfaces, wherein the second surface of the device layer corresponds to the second surface of the third section; and
    an insulating layer having first and second opposing surfaces, wherein the first surface of the insulating layer corresponds to the first surface of the third section,
  wherein at least one of the one or more conductive structures in the at least one of the at least two semiconductor structures extends between select ones of the plurality of electrical connections in the device layer of the second section, select ones of the plurality of electrical connections in the device layer of the third section, and select portions on or beneath the second surface of the at least one of the at least two semiconductor structures.

* * * * *

UNITED STATES PATENT AND TRADEMARK OFFICE
CERTIFICATE OF CORRECTION

PATENT NO. : 9,780,075 B2
APPLICATION NO. : 15/327235
DATED : October 3, 2017
INVENTOR(S) : Rabindra N. Das et al.

Page 1 of 2

It is certified that error appears in the above-identified patent and that said Letters Patent is hereby corrected as shown below:

In the Specification

Column 5, Line 19, delete "structure structures." and replace with --structures--

Column 5, Line 30, delete "structure structures." and replace with --structures--

Column 5, Line 52, delete "structure structures." and replace with --structures--

Column 6, Line 29, delete "first second" and replace with --first and second--

Column 9, Line 61, delete "first second" and replace with --first and second--

Column 10, Line 9, delete "interdiffuse" and replace with --interdiffuses--

Column 10, Line 35, delete "an about" and replace with --about--

Column 10, Line 39-40, delete "electrically the via," and replace with --electrically coupled to the via--

Column 11, Line 48, delete "device," and replace with --devices,--

Column 12, Line 64, delete "layers 142" and replace with --layers 142, 146--

Column 13, Line 2, delete "embodiment" and replace with --embodiments--

Column 14, Line 1, delete "in presence" and replace with --in the presence--

Column 14, Line 18, delete "may deposited" and replace with --may be deposited--

Column 15, Line 2, delete "ma" and replace with --may--

Signed and Sealed this
Twenty-fifth Day of June, 2019

Andrei Iancu
*Director of the United States Patent and Trademark Office*

CERTIFICATE OF CORRECTION (continued)
U.S. Pat. No. 9,780,075 B2

Column 15, Line 25, delete "need" and replace with --needed--

Column 17, Line 60, delete ". Example electrically" and replace with --. Examples of electrically--

Column 18, Line 22, delete ") and or" and replace with --) and/or--

Column 22, Line 20, delete "(X≤5.1)" and replace with --(X≤1)--

Column 22, Line 28, delete "plurality electrical" and replace with --plurality of electrical--

Column 22, Lines 30-31, delete "plurality electrical" and replace with --plurality of electrical--

Column 23, Line 64, delete "coupled the" and replace with --coupled to the--

Column 25, Line 50, delete "representative a" and replace with --representative of a--

Column 26, Line 48, delete ",380", 380" through" and replace with --,380", 380''' through--

Column 27, Line 3-4, delete "structures 2311, 2312, 2313, 2314 structures includes" and replace with --structures 2311, 2312, 2313, 2314 include--

Column 27, Line 20, delete "structure 300" and" and replace with --structure 300''' and--

Column 27, Line 23, delete "and other" and replace with --and the other--

Column 27, Line 46, delete "and or" and replace with --and/or--

Column 28, Line 43, delete "structure 300" also" and replace with --structure 300''' also--

Column 28, Line 59, delete "and or" and replace with --and/or--

Column 29, Line 18, delete "such second" and replace with --such that the second--

Column 29, Line 55, delete "surface" and replace with --surfaces--

Column 30, Line 15, delete "Via" and replace with --via--

Column 30, Line 16, delete "metal layers multiple" and replace with --metal layers with multiple--

Column 30, Line 34, delete "structure" and replace with --structures--

Column 30, Line 40, delete "structure" and replace with --structures--

Column 31, Line 5, delete "that that" and replace with --that the--